(12) United States Patent
Ryu et al.

(10) Patent No.: US 12,433,069 B2
(45) Date of Patent: Sep. 30, 2025

(54) DISPLAY DEVICE MANUFACTURING APPARATUS, METHOD OF MANUFACTURING DISPLAY DEVICE USING THE SAME, AND DISPLAY DEVICE MANUFACTURED BY THE SAME

(71) Applicant: Samsung Display Co., LTD., Yongin-si (KR)

(72) Inventors: An Na Ryu, Yongin-si (KR); Jin Oh Kwag, Yongin-si (KR); Jong Hyuk Kang, Yongin-si (KR); Sung Hoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 704 days.

(21) Appl. No.: 17/532,312

(22) Filed: Nov. 22, 2021

(65) Prior Publication Data

US 2022/0310876 A1    Sep. 29, 2022

(30) Foreign Application Priority Data

Mar. 25, 2021    (KR) .................. 10-2021-0039072

(51) Int. Cl.
*H10H 20/831*    (2025.01)
*B05B 7/04*    (2006.01)
(Continued)

(52) U.S. Cl.
CPC .......... *H10H 20/831* (2025.01); *B05B 7/0408* (2013.01); *B05B 12/004* (2013.01); *H10H 20/01* (2025.01); *H10H 20/032* (2025.01)

(58) Field of Classification Search
CPC .......... H01L 2224/95101–95102; H01L 22/10; H01L 33/00; B05B 12/004; B05B 7/04–0408
See application file for complete search history.

(56) References Cited

U.S. PATENT DOCUMENTS

| 10,338,712 B2 | 7/2019 | Bok et al. |
| 2006/0170733 A1 | 8/2006 | Lee et al. |

(Continued)

FOREIGN PATENT DOCUMENTS

| CN | 112133210 | 12/2020 | |
| GB | 2140326 A | * 11/1984 | ............... B05B 7/04 |

(Continued)

OTHER PUBLICATIONS

International Search Report corresponding to International Application No. PCT/KR2021/015804 dated Feb. 10, 2022.

*Primary Examiner* — Dah-Wei D. Yuan
*Assistant Examiner* — Stephen A Kitt
(74) *Attorney, Agent, or Firm* — Womble Bond Dickinson (US) LLP

(57) ABSTRACT

A display device manufacturing apparatus includes a first reservoir accommodating a solvent; a second reservoir accommodating a light emitting element; a mix chamber accommodating an ink including the solvent and the light emitting element ; a first channel connecting the first reservoir and the mix chamber; a second channel connecting the second reservoir and the mix chamber; and a counter that obtains information on a number of the light emitting elements that are moved in the second channel.

19 Claims, 15 Drawing Sheets

(51) Int. Cl.
B05B 12/00 (2018.01)
H10H 20/01 (2025.01)

(56) References Cited

U.S. PATENT DOCUMENTS

| | | |
|---|---|---|
| 2018/0128733 A1 | 5/2018 | Goradia et al. |
| 2018/0138157 A1 | 5/2018 | Im et al. |
| 2020/0251642 A1 | 8/2020 | Lim |
| 2020/0286870 A1* | 9/2020 | Sasaki .................. H01L 33/486 |
| 2022/0068876 A1 | 3/2022 | Do et al. |

FOREIGN PATENT DOCUMENTS

| | | |
|---|---|---|
| JP | 5477538 | 4/2014 |
| KR | 10-2006-0088373 | 8/2006 |
| KR | 10-2018-0055021 | 5/2018 |
| KR | 10-2019-0068644 | 6/2019 |
| KR | 10-2019-0096474 | 8/2019 |
| KR | 10-2020-0084476 | 7/2020 |
| KR | 10-2020-0088949 | 7/2020 |
| KR | 10-2021-0025144 | 3/2021 |

\* cited by examiner

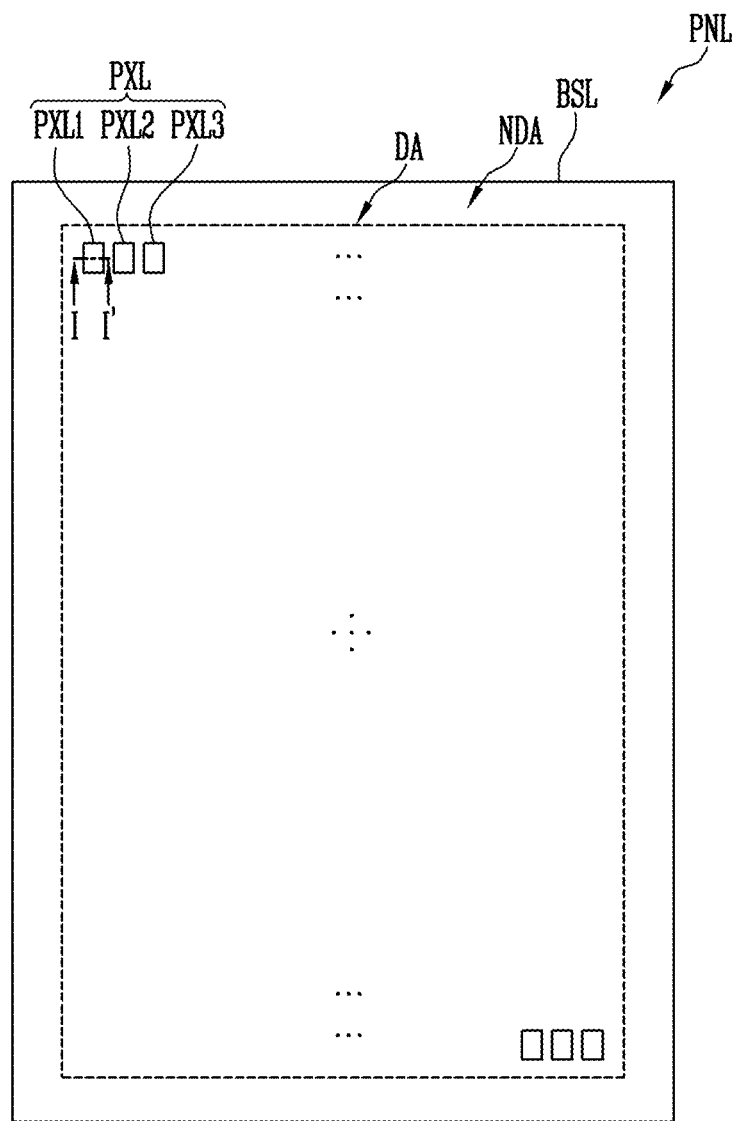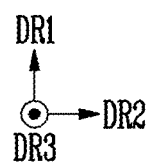

DISPLAY DEVICE MANUFACTURING APPARATUS, METHOD OF MANUFACTURING DISPLAY DEVICE USING THE SAME, AND DISPLAY DEVICE MANUFACTURED BY THE SAME

CROSS-REFERENCE TO RELATED APPLICATION(S)

This application claims priority to and benefits of Korean Patent Application No. 10-2021-0039072 under 35 U.S.C. § 119, filed on Mar. 25, 2021 in the Korean Intellectual Property Office, the entire contents of which are incorporated herein by reference.

BACKGROUND

1. Technical Field

The disclosure relates to a display device manufacturing apparatus, a method of manufacturing a display device using the same, and a display device manufactured by the same.

2. Description of the Related Art

In recent years, as interest in information display is increasing, research and development for a display device are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device manufacturing apparatus, a method of manufacturing a display device using the same, and a display device manufactured by the same capable of reducing a process cost and uniformly providing an amount of a light emitting element in a pixel by controlling the amount of the light emitting element.

Objects of the disclosure are not limited to the above-described objects, and other technical objects which are not described will be clearly understood by those skilled in the art from the following description.

According to an embodiment of the disclosure, a display device manufacturing apparatus may include a first reservoir accommodating a solvent; a second reservoir accommodating a light emitting element; a mix chamber accommodating an ink including the solvent and the light emitting element; a first channel connecting the first reservoir and the mix chamber; a second channel connecting the second reservoir and the mix chamber; and a counter that obtains information on a number of the light emitting elements that are moved in the second channel.

According to an embodiment, the first channel and the second channel may be fluidly blocked from each other.

According to an embodiment, the first channel and the second channel may be a manifold.

According to an embodiment, the first channel may include a first body channel and a first branch channel connected with the first body channel, and the second channel may include a second body channel and a second branch channel connected with the second body channel.

According to an embodiment, the mix chamber may be fluidly connected to each of the first branch channel and the second branch channel.

According to an embodiment, the counter may be adjacent to the second branch channel.

According to an embodiment, a controller may be electrically connected to the counter, and the controller calculates a number of the light emitting elements passing through the second branch channel based on the information on the number of the light emitting elements.

According to an embodiment, the counter may be at least one of an image analyzer, a counter performing a laser diffraction method, a counter performing a dynamic light scattering method, and a counter performing an electronic sensing method.

According to an embodiment, an open and close unit having an open state or a close state may be further included, in case that the open and close unit has the close state, the second branch channel and the mix chamber are fluidly blocked, and in case that the open and close unit has the open state, the second branch channel and the mix chamber are fluidly connected.

According to an embodiment, a controller may be electrically connected to the counter in case that the controller receives a first number signal from the counter, the open and close unit has the open state, and in case that the controller receives a second number signal different from the first number signal from the counter, the open and close unit has the close state.

According to an embodiment, the display device manufacturing apparatus may further comprise a nozzle that discharges the ink, and the nozzle may be connected to the mix chamber.

According to an embodiment, a cross-sectional area of the second branch channel may differ according to a length direction of the second branch channel.

According to an embodiment, a movement inducement unit may induce movement of the light emitting element in the second channel, and the movement inducement unit applies an external force toward the mix chamber to the light emitting element in the second channel.

According to an embodiment, the movement inducement unit may be at least one of an electrode that forms an electric field applied to the light emitting element, an air flow generator that forms a flow of air toward the mix chamber, and an actuator that applies the external force toward the mix chamber to the light emitting element.

According to an embodiment, the mix chamber may include a first mix chamber; and a second mix chamber, the first mix chamber may be connected to the first channel, and the second mix chamber may be connected to the second channel.

According to an embodiment, a display device manufacturing apparatus may include an integrated reservoir accommodating an ink including light emitting elements and a solvent; a mix chamber accommodating the ink and including a discharge path through which the ink is discharged; an integrated channel connected between the integrated reservoir and the mix chamber; a counter that obtains information on a number of the light emitting elements accommodated in the mix chamber; and an open and close unit that opens or closes the discharge path of the mix chamber based on the information on the number of the light emitting elements.

According to an embodiment, a method of manufacturing a display device using a display device manufacturing apparatus may include preparing a substrate including a base substrate, and a first electrode and a second electrode disposed on the base substrate; providing an ink on the substrate; and forming an electric field between the first electrode and the second electrode; and the providing of the ink may include disposing at least a portion of the ink provided from a mix chamber between the first electrode and the second electrode, and forming the electric field may include disposing a light emitting element between the first electrode and the second electrode.

According to an embodiment, the method may further include an open and close unit having an open state or a close state, a first channel may include a first body channel and a first branch channel connected with the first body channel, the second channel may include a second body channel and a second branch channel connected with the second body channel, in case that the open and close unit has the open state, the second branch channel and the mix chamber may be fluidly blocked, and in case that the open and close unit has the open state, the second branch channel and the mix chamber may be fluidly connected.

According to an embodiment, the method may include a first mix chamber accommodating a solvent; and a second mix chamber accommodating a light emitting element ink; the light emitting element ink may include a fluid and the light emitting element dispersed in the fluid, the first mix chamber may be connected to the first channel, the second mix chamber may be connected to the second channel, the providing of the ink may include providing the solvent accommodated in the first mix chamber to a spray position at a first time point; and providing the light emitting element ink accommodated in the second mix chamber to the spray position at a second time point different from the first time point.

According to an embodiment, a display device manufactured by using the display device manufacturing apparatus may be provided.

A solution means of the object of the disclosure is not limited to the above-described solution means, and other solution means will be clearly understood by those skilled in the art from the specification and the accompanying drawings.

According to an embodiment, a display device manufacturing apparatus, a method of manufacturing a display device using the same, and a display device manufactured by the same capable of reducing a process cost and uniformly providing an amount of a light emitting element in a pixel by controlling the amount of the light emitting element may be provided.

An effect of the disclosure is not limited to the above-described effects, and effects which are not described will be clearly understood by those skilled in the art from the specification and the accompanying drawings.

BRIEF DESCRIPTION OF THE DRAWINGS

The above and other features of the disclosure will become more apparent by describing in further detail embodiments thereof with reference to the accompanying drawings, in which:

FIG. 3 is a schematic plan view illustrating a display device including a light emitting element according to an embodiment;

DETAILED DESCRIPTION OF THE EMBODIMENTS

Figure 1:
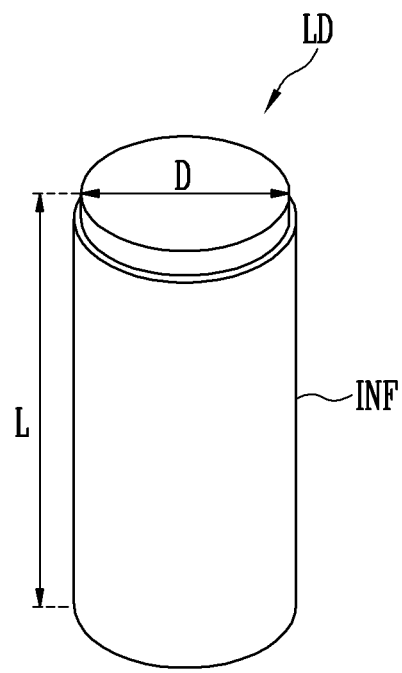
FIGS. 1 and 2 are schematic perspective and schematic cross-sectional views illustrating a light emitting element according to an embodiment.

Embodiments described herein are for clearly describing the spirit and scope of the disclosure to those skilled in the art to which the disclosure pertains. However, the disclosure is not limited by the described embodiments, and the scope of the disclosure should be interpreted as including modifications or variations within the spirit and the scope of the disclosure.

A term or terms used in the specification may be selected as a general term or terms, the term or terms may vary according as understood by those skilled in the art to which the disclosure pertains, customs, the appearance of new technologies, or the like within the spirit and the scope of the disclosure. However, when a term is defined as including another meaning and used, the meaning of the term will be described separately. Therefore, the term used in the specification should be interpreted based on the given meaning of the term and contents throughout the specification.

For example, unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The drawings attached to the specification are intended to describe the disclosure. Since a shape or shapes shown in the drawings may be exaggerated and displayed as necessary to help understanding of the disclosure, the disclosure is not limited by the drawings.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The disclosure relates to a display device manufacturing apparatus, a method of manufacturing a display device using the same, and a display device manufactured by the same. Hereinafter, a display device manufacturing apparatus, a method of manufacturing a display device using the same, and a display device manufactured by the same according to an embodiment are described with reference to FIGS. 11 to 19.

Prior to describing the display device manufacturing apparatus (refer to '1' of FIG. 5) according to an embodiment, the display device manufactured by the display device manufacturing apparatus 1 is described with reference to FIGS. 1 to 4.

Figure 2:
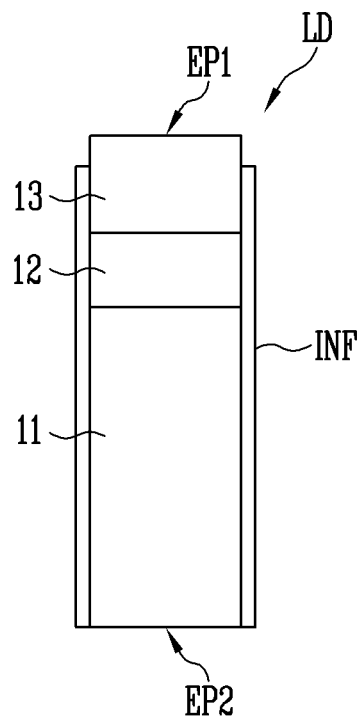

FIGS. 1 and 2 show a light emitting element LD included in the display device according to an embodiment. FIGS. 1 and 2 are schematic perspective and schematic cross-sectional views illustrating a light emitting element according to an embodiment. FIGS. 1 and 2 show a column shape light emitting element LD, but a type and/or a shape of the light emitting element LD are/is not limited thereto.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, in case that an extension direction of the light emitting element LD is a length L direction, the light emitting element LD may include the first semiconductor layer 11, the active layer 12, and the second semiconductor layer 13 sequentially stacked along the length L direction.

According to an embodiment, the light emitting element LD may have a column shape extending along one direction or a direction. The light emitting element LD may include a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD.

According to an embodiment, the column shape encompasses a rod-like shape or a bar-like shape that is long in the length L direction (for example, an aspect ratio is greater than 1), such as a substantially circular column or a substantially polygonal column, and a shape of a cross section thereof is not particularly limited. For example, a length L of the light emitting element LD may be greater than a diameter D (or a width of the cross section) thereof.

According to an embodiment, the light emitting element LD may have a size as small as a nano scale (nanometer scale) to a micro scale (micrometer scale). For example, each light emitting element LD may have the diameter D (or width) and/or the length L of the nano scale to micro scale range.

However, a size of the light emitting element LD is not limited thereto, and the size of the light emitting element LD may be variously changed according to a design condition of various devices using a light emitting device using the light emitting element LD as a light source, for example, a display device.

According to an embodiment, the first semiconductor layer 11 may be a semiconductor layer of a first conductivity type. For example, the first semiconductor layer 11 may include an N-type semiconductor layer. For example, the first semiconductor layer 11 may include any one semiconductor material among InAlGaN, GaN, AlGaN, InGaN, AlN, and InN, and may include the N-type semiconductor layer doped with a first conductivity type dopant such as Si, Ge, and Sn. However, the material configuring or forming the first semiconductor layer 11 is not limited thereto.

According to an embodiment, the active layer 12 may be disposed on the first semiconductor layer 11 and may be formed in a single-quantum well or multi-quantum well structure. A position of the active layer 12 may be variously changed according to the type of the light emitting element LD.

Although not shown in a separate drawing, according to an embodiment, a clad layer doped with a conductive dopant may be formed or disposed on and/or under or below the active layer 12. For example, the clad layer may be formed of an AlGaN layer or an InAlGaN layer. According to an embodiment, a material of AlGaN, InAlGaN, or the like may be used to form the active layer 12, and various other materials may configure or form the active layer 12.

According to an embodiment, the second semiconductor layer 13 may be disposed on the active layer 12 and may include a semiconductor layer of a type different from that of the first semiconductor layer 11. For example, the second semiconductor layer 13 may include a P-type semiconductor layer. For example, the second semiconductor layer 13 may include at least one semiconductor material among InAlGaN, GaN, AlGaN, InGaN, AlN, and InN, and may include the P-type semiconductor layer doped with a second conductivity type dopant such as Mg. However, the material configuring or forming the second semiconductor layer 13 is not limited thereto.

In case that a voltage equal to or greater than a threshold voltage is applied to both ends of the light emitting element LD, an electron-hole pair is combined in the active layer 12 and thus the light emitting element LD emits light. By controlling light emission of the light emitting element LD using such a principle, the light emitting element LD may be used as a light source of various light emitting devices including a pixel (refer to 'PXL' of FIG. 3) of the display device.

According to an embodiment, the light emitting element LD may further include an insulating layer INF provided on a surface. The insulating layer INF may be formed or disposed on the surface or on a surface of the light emitting element LD so as to surround at least an outer surface of the active layer 12, and may further surround one region or a region of the first and second semiconductor layers 11 and 13.

According to an embodiment, the insulating layer INF may expose both end portions of the light emitting element LD having different polarities. For example, the insulating layer INF may expose one end or an end of each of the first and second semiconductor layers 11 and 13 positioned or disposed at the first and second end portions EP1 and EP2 of the light emitting element LD. In an embodiment, the insulating layer INF may expose a side portion of the first and second semiconductor layers 11 and 13 adjacent to the first and second end portions EP1 and EP2 of the light emitting element LD having different polarities.

According to an embodiment, the insulating layer INF may include any one of silicon oxide (SiOx), silicon nitride (SiNx), silicon oxynitride (SiOxNy), aluminum oxide (AlOx), and titanium oxide (TiOx). The insulating layer INF may be implemented as a single layer or multiple layers, but is not limited thereto.

According to an embodiment, in case that the insulating layer INF is provided, electrical stability of the light emitting element LD may be ensured, and a surface defect of the light emitting element LD may be reduced.

Although not shown in a separate drawing, according to an embodiment, the light emitting element LD may additionally include at least one phosphor layer, an active layer, a semiconductor layer and/or an electrode layer disposed on one end side or an end side of the first semiconductor layer 11, the active layer 12 and/or the second semiconductor layer 13.

The type, structure, shape, and/or the like of the light emitting element LD are/is not limited to the above-described example, and may be variously changed. For example, the light emitting element LD may be formed in a core-shell structure having a substantially polygonal cone shape.

A light emitting device including the light emitting element LD described above may be used in various types of devices that require a light source, including a display device. For example, light emitting elements LD may be disposed in each pixel PXL of a display panel (refer to 'PNL' of FIG. 3), and the light emitting elements LD may be used as a light source of each pixel (PXL).

However, an application field of the light emitting element LD is not limited to the above-described example. For example, the light emitting element LD may also be used in other types of devices that require a light source, such as a lighting device.

FIG. 3 is a schematic plan view illustrating a display device including a light emitting element according to an embodiment. FIG. 3 shows a display device as an example of an electronic device that may use the light emitting element LD as a light source. For example, the display panel PNL provided in the display device is described with reference to FIG. 3.

Referring to FIG. 3, the display panel PNL may include a base substrate BSL and the pixel PXL disposed on the base substrate BSL. Pixels PXL may be provided or disposed on the base substrate BSL. According to an embodiment, the display panel PNL may further include a driving circuit unit or driving circuit (for example, a scan driver and/or a data driver), lines, and/or pads.

The base substrate BSL forms a base member of the display panel PNL, and may be a rigid or flexible substrate or film.

The display panel PNL and the base substrate BSL may include a display area DA for displaying an image and a non-display area NDA except for the display area DA.

The pixel PXL may be disposed in the display area DA. The pixel PXL may include the light emitting element LD. The pixels PXL may be arranged or disposed according to a stripe or PenTile® arrangement structure. However, the arrangement structure of the pixels PXL is not limited thereto.

The various lines, the pads, and/or built-in circuit units electrically connected to the pixel PXL of the display area DA may be disposed in the non-display area NDA. The non-display area NDA may be an area except for the display area DA, and may mean an area in which the pixel PXL is not disposed.

According to an embodiment, two or more types of pixels PXL emitting light of different colors may be disposed in the display area DA. For example, the pixel PXL may include a first pixel PXL1 emitting light of a first color, a second pixel PXL2 emitting light of a second color, and a third pixel PXL3 emitting light of a third color.

According to an embodiment, the first to third pixels PXL1, PXL2, and PXL3 may configure or form one pixel unit capable of emitting light of various colors. For example, each of the first to third pixels PXL1, PXL2, and PXL3 may be a sub pixel emitting light of a color. For example, the first pixel PXL1 may be a red pixel emitting red light, the second pixel PXL2 may be a green pixel emitting green light, and the third pixel PXL3 may be a blue pixel emitting blue light, but are not limited thereto.

According to an embodiment, the pixel PXL may include at least one light source driven by a control signal (for example, a scan signal and a data signal) and/or power (for example, first power and second power applying a voltage different from that of the first power).

According to an embodiment, each pixel PXL may be an active pixel. However, a type, a structure, and/or a driving method of the pixels PXL applicable to the display device are/is not limited. For example, each pixel PXL may be a pixel of a passive or active light emitting display device of various structures and/or driving methods.

Figure 4:
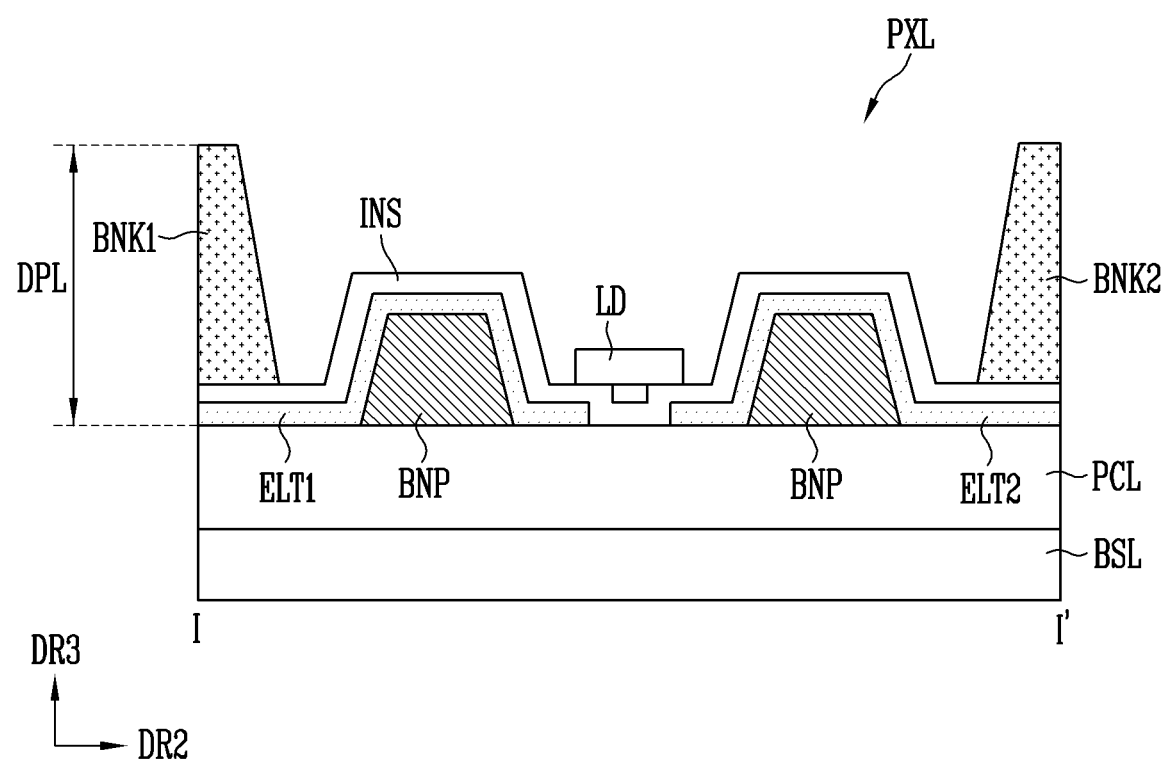
FIG. 4 is a schematic cross-sectional view taken along I~I' of FIG. 3.

Hereinafter, the structure of each pixel PXL is described with reference to FIG. 4. FIG. 4 is a schematic cross-sectional view taken along I~I' of FIG. 3.

Referring to FIG. 4, the pixel PXL may include the base substrate BSL, a pixel circuit part PCL, and a display element unit DPL.

The base substrate BSL may be a base surface of the pixel PXL. The base substrate BSL may be a rigid or flexible substrate. According to an example, the base substrate BSL may include a rigid material or a flexible material, but is not limited to a given example.

The pixel circuit part PCL may be disposed on the base substrate BSL. The pixel circuit part PCL may include a transistor and insulating layers. The transistor may be a thin film transistor, and may be a driving transistor according to an embodiment. Any one of the insulating layers may be disposed on the transistor. A structure of the pixel circuit part PCL is not limited to any given example, and various structures may be applied.

The display element unit DPL may be disposed on the pixel circuit part PCL. The display element unit DPL may include a bank pattern BNP, a first electrode ELT1, a second electrode ELT2, an insulating layer INS, the light emitting element LD, a first bank BNK1, and a second bank BNK2.

The bank pattern BNP may have a shape extending (or protruding) or substantially extending (or protruding) in an upper direction. At least a portion of each of the first electrode ELT1 and the second electrode ELT2 may be disposed on the bank pattern BNP, and thus a reflective partition wall or bank may be formed. Since the reflective partition wall or bank is formed, luminous efficiency of the light emitting element LD may be improved. According to an example, the upper direction may mean a third direction DR3. By way of example, the upper direction may mean a display direction in which light of the light emitting element LD may be emitted.

The first electrode ELT1 and the second electrode ELT2 may be disposed on the pixel circuit part PCL. According to an example, at least a portion of each of the first electrode ELT1 and the second electrode ELT2 may be disposed on the bank pattern BNP.

According to an embodiment, the first electrode ELT1 may be electrically connected to the light emitting element LD. Although not shown in the drawing, a first contact electrode may be disposed on the insulating layer INS, and the first electrode ELT1 may be electrically connected to the light emitting element LD through the first contact electrode.

According to an embodiment, the second electrode ELT2 may be electrically connected to the light emitting element LD. Although not shown in the drawing, a second contact electrode may be disposed on the insulating layer INS, and the second electrode ELT2 may be electrically connected to the light emitting element LD through the second contact electrode.

According to an embodiment, the first electrode ELT1 and the second electrode ELT2 may function as alignment electrodes for the light emitting element LD. For example, the light emitting element LD may be included in an ink (refer to 'INK' of FIG. 7) and provided, and thereafter, the light emitting element LD may be arranged or disposed based on an electric field formed between the first electrode ELT1 and the second electrode ELT2. A detailed content related to this is described later with reference to FIGS. 13 to 19.

The insulating layer INS may be disposed on the first electrode ELT1 and/or the second electrode ELT2. The insulating layer INS may include at least one of silicon nitride (SiNx), silicon oxide (SiOx), silicon oxynitride (SiOxNy), and aluminum oxide (AlOx), but is not limited thereto. The insulating layer INS may stabilize electrical connection of electrode configurations included in the display element unit DPL and may reduce an external influence.

The light emitting element LD may be disposed on the insulating layer INS. According to an example, the insulating layer INS may have a groove (or a cavity), at least a portion of the light emitting element LD may be in contact with an end portion formed from the groove, and another portion of the light emitting element LD may be in contact with another end portion formed by the groove. The light emitting element LD may be the light emitting element LD described above with reference to FIGS. 1 and 2.

According to an embodiment, the light emitting element LD may emit light based on an electrical signal provided through the first electrode ELT1 and an electrical signal provided through the second electrode ELT2.

The first bank BNK1 and the second bank BNK2 may be structures defining an emission area of the pixel PXL. Here, the emission area may mean an area in which the light emitting element LD is disposed and thus light is emitted, as an area in which the first bank BNK1 and the second bank BNK2. For example, the first bank BNK1 and the second bank BNK2 may be disposed in a boundary area between adjacent light emitting elements LD to surround the light emitting element LD of the pixel PXL.

A disposition relationship regarding the light emitting element LD, the electrode configuration, and the like is not limited to the example described above with reference to FIG. 4, and a disposition relationship may vary according to various embodiments and may be implemented.

Hereinafter, the display device manufacturing apparatus 1 according to an embodiment is described with reference to FIGS. 5 to 12. Hereinafter, for convenience of description, the display device manufacturing apparatus 1 is briefly described as a manufacturing apparatus 1.

Figure 5:
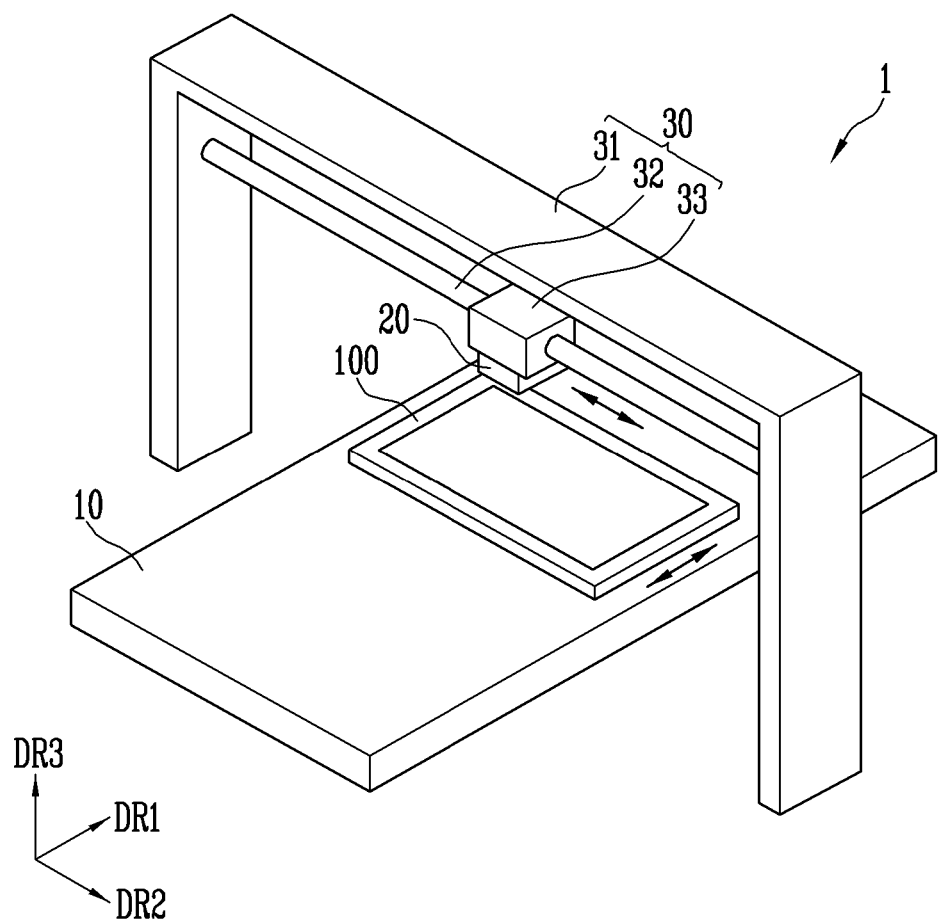
FIG. 5 is a schematic perspective view illustrating a display device manufacturing apparatus according to an embodiment.
Figure 6:
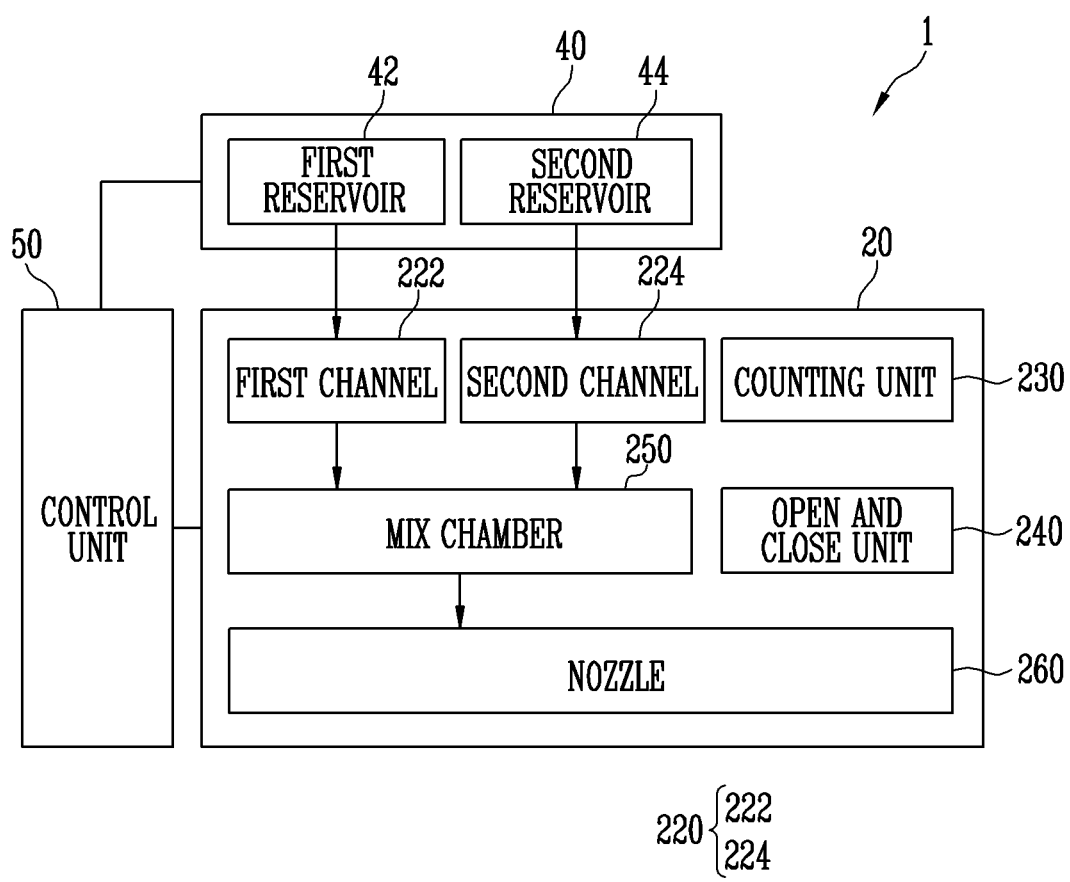
FIG. 6 is a block diagram illustrating a display device manufacturing apparatus according to an embodiment.
Figure 7:
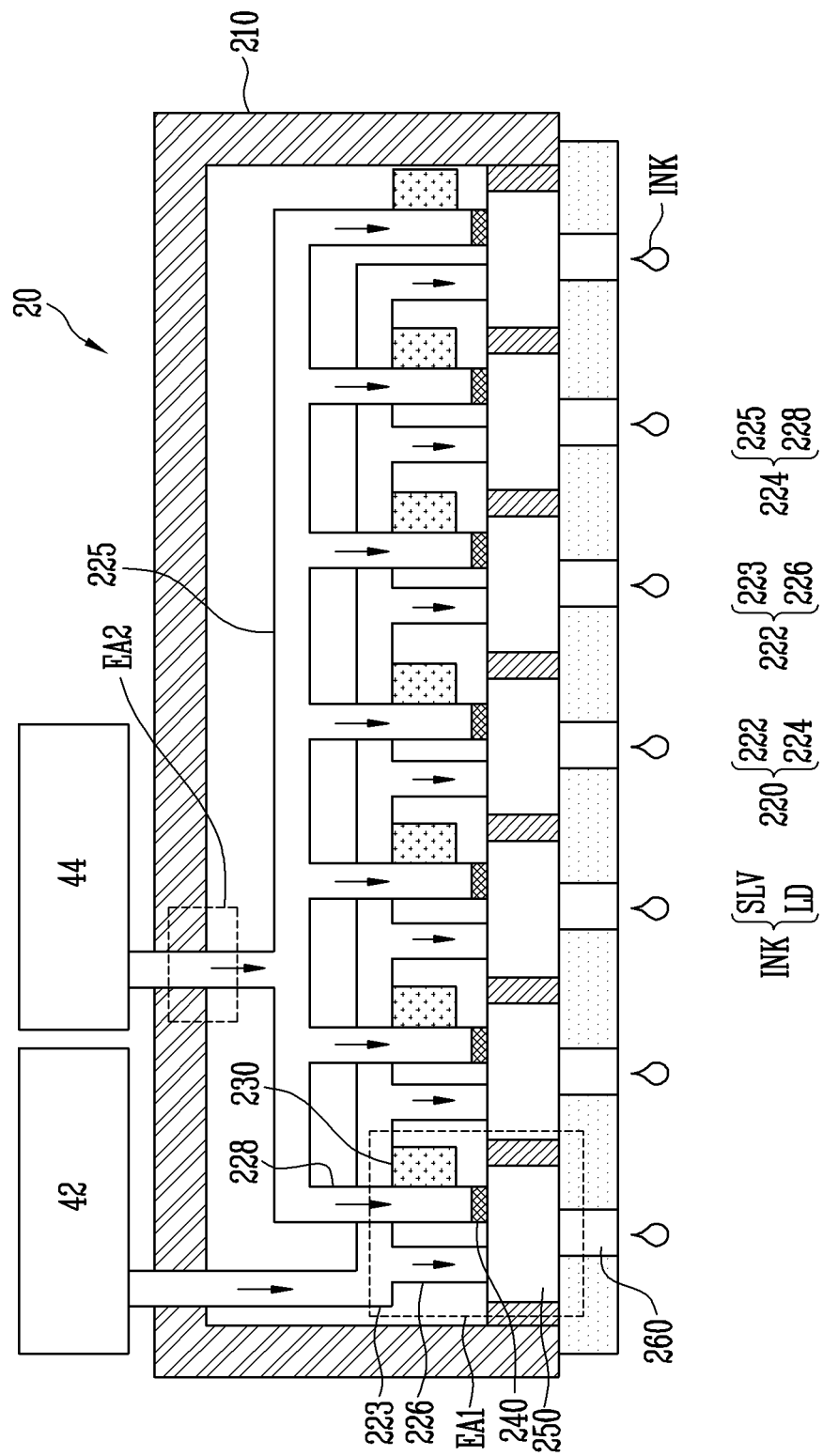
FIG. 7 is a schematic cross-sectional view schematically illustrating a print head unit and a reservoir included in a display device manufacturing apparatus according to an embodiment.

FIG. 5 is a schematic perspective view illustrating the display device manufacturing apparatus 1 according to an embodiment. FIG. 6 is a block diagram illustrating the display device manufacturing apparatus 1 according to an embodiment. FIG. 7 is a schematic cross-sectional view schematically illustrating a print head unit or print head and a reservoir included in a display device manufacturing apparatus 1 according to an embodiment.

Referring to FIG. 5, the manufacturing apparatus 1 may include a stage 10, a print head unit 20, and a movement unit or mover 30. According to an embodiment, the manufacturing apparatus 1 may be referred to as a print apparatus.

The stage 10 may support a substrate 100. The stage 10 may provide a region in which the substrate 100 may be disposed. Here, the substrate 100 may be a substrate for manufacturing the display panel PNL that displays an image. The substrate 100 may include the base substrate BSL and the pixel circuit part PCL (refer to FIG. 14). The light emitting element LD may be arranged or disposed on the substrate 100, and thus the pixel PXL described above with reference to FIG. 4 may be provided.

According to an embodiment, the stage 10 may have a rigid material, but is not limited thereto. The stage 10 may have a substantially rectangular parallelepiped shape in a plan view, but is not limited thereto.

According to an embodiment, the stage 10 may change a position of the substrate 100. For example, the stage 10 may move the substrate 100 using a rail or the like within the spirit and the scope of the disclosure. According to an embodiment, the substrate 100 may be moved in a first direction DR1 by the stage 10.

The print head unit 20 may be disposed on the stage 10. The print head unit 20 may be disposed between the stage 10 and the movement unit 30.

According to an embodiment, the print head unit 20 may discharge (provide, or spray) the ink INK. The ink INK may include the light emitting element LD and a solvent (refer to "SLV" of FIG. 7). The ink INK may be provided by mixing the light emitting element LD and the solvent SLV. Here, the light emitting element LD may be provided by being dispersed in the solvent SLV.

According to an embodiment, the print head unit 20 may be moved in a second direction DR2 by a guide unit or guide 32. As described above, a position of the substrate 100 and a position of the print head unit 20 may be adjusted, and thus a region on the substrate 100 to which the ink INK is provided may be adjusted.

A detailed content of the print head unit 20 is described later with reference to FIGS. 6 to 12.

The movement unit 30 may be combined with the print head unit 20. The movement unit 30 may move the print head unit 20.

According to an embodiment, the movement unit 30 may include a support unit or support 31, a guide unit 32, and a coupling unit or coupler 33. The support unit 31 may support the print head unit 20. The guide unit 32 may be coupled or connected to the support unit 31 to guide the movement of the print head unit 20. The coupling unit 33 may be coupled or connected to the print head unit 20 and may be movable along the guide unit 32.

For example, the print head unit 20 is required to be moved along the second direction DR2, the coupling unit 33 may be moved along the guide unit 32 in the second direction DR2, and the position of the print head unit 20 may be changed along the second direction DR2.

Referring to FIG. 6, the manufacturing apparatus 1 may further include a reservoir 40 and a control unit or controller 50.

The reservoir 40 may include a space to accommodate a fluid. For example, a fluid (or material) may be included in the reservoir 40. The solvent SLV and/or the light emitting element LD may be provided in the reservoir 40.

According to an embodiment, an internal environment of the reservoir 40 may be controlled by the control unit 50. For example, a temperature in the reservoir 40 may be appropriately selected by the control unit 50.

According to an embodiment, the reservoir 40 may be provided separately from the print head unit 20. For example, as shown in FIG. 7, the reservoir 40 may be provided in an external space of a housing (refer to "210" of FIG. 7). However, the disclosure is not limited thereto, and according to an embodiment, the reservoir 40 may be included in the print head unit 20 and provided. For example, at least a portion of the reservoir 40 may be provided in the housing 210.

According to an embodiment, the reservoir 40 may accommodate the solvent SLV and/or the light emitting element LD. The reservoir 40 may include a first reservoir 42 to accommodate the solvent SLV and a second reservoir 44 to accommodate the light emitting element LD.

According to an embodiment, the first reservoir 42 may include a space in which the solvent SLV included in the ink INK may be accommodated. The first reservoir 42 may be fluidly connected to a first channel 222. For example, the solvent SLV accommodated in the first reservoir 42 may be moved to the first channel 222. "Fluidly connected" may mean a connection state in which a specific region and another region are open to each other so that a fluid (e.g. air, liquid material) can move.

According to an embodiment, the first reservoir 42 may be fluidly blocked (or separated) from a second channel 224. For example, the first reservoir 42 may be connected to the first channel 222 without being connected to the second channel 224, and thus the solvent SLV may not be provided to the second channel 224.

According to an embodiment, the second reservoir 44 may include a space in which the light emitting element LD included in the ink INK may be accommodated. The second reservoir 44 may be fluidly connected to the second channel 224. For example, the light emitting element LD accommodated in the second reservoir 44 may be moved to the second channel 224.

According to an embodiment, the second reservoir 44 may be fluidly blocked (or separated) from the first channel 222. For example, the second reservoir 44 may be connected to the second channel 224 without being connected to the first channel 222, and thus the light emitting element LD may not be provided to the first channel 222.

The control unit 50 may control an overall operation of the manufacturing apparatus 1. For example, the control unit 50 may control the fluid or material accommodated in the reservoir 40 to be discharged to an outside of the reservoir 40. By way of example, the control unit 50 may change a pose of the open and close unit 240 included in the print head unit 20 to an open state or a close state. The control unit 50 may be electrically connected (wireless or wired) to the open and close unit 240. The control unit 50 may control an operation of a nozzle 260, so that the ink INK accommodated in a mix chamber 250 is discharged to the outside or is not discharged to the outside.

According to an embodiment, the control unit 50 may calculate the number of light emitting elements LD passing through the second channel 224 from information on the number of light emitting elements LD provided from a counting unit or counter 230. The control unit 50 may determine whether to operate the open and close unit 240 based on the information on the number of light emitting elements LD provided from the counting unit 230.

According to an embodiment, the control unit 50 may be implemented as a CPU or a device similar thereto according to hardware, software, or a combination thereof. In terms of hardware, the control unit 50 may be provided in a form of an electronic circuit that performs a control function by processing an electrical signal. In terms of software, the control unit 50 may be provided in a form of a program, an application, firmware, and the like processed by the hardware control unit 50.

FIG. 6 show the control unit 50 of a single configuration, but is not limited thereto. According to an embodiment, the control unit 50 may be implemented by being separated into various configurations. For example, the control unit 50 may include a first control unit that controls an operation of the reservoir 40 and a second control unit that controls the print head unit 20. The control unit 50 may be provided separately from the print head unit 20, but is not limited thereto. According to an example, the control unit 50 may be included in the print head unit 20 and provided.

Hereinafter, the manufacturing apparatus 1 according to an embodiment is described in more detail with reference to FIGS. 6 and 7.

Referring to FIGS. 6 and 7, the print head unit 20 may include the housing 210, channels 220, the counting unit 230, the open and close unit 240, the mix chamber 250, and the nozzle 260.

According to an embodiment, the housing 210 may support an outer shape of the print head unit 20. An individual configuration of the print head unit 20 may be disposed in the housing 210.

According to an embodiment, the channels 220 may include the first channel 222 and the second channel 224. The first channel 222 and the second channel 224 may be separated (or fluidly blocked) from each other. Accordingly, mixture of fluids (materials, and the like) provided to each of the first and second channels 222 and 224 may be prevented.

According to an embodiment, the first channel 222 may be connected to the first reservoir 42. The first channel 222 may connect the first reservoir 42 and the mix chamber 250 to each other. The first channel 222 may be a path through which the solvent SLV accommodated in the first reservoir 42 is provided. Accordingly, the solvent SLV provided from the first reservoir 42 may be provided to the mix chamber 250 via the first channel 222.

According to an embodiment, the second channel 224 may be connected to the second reservoir 44. According to an embodiment, the second channel 224 may connect the second reservoir 44 and the mix chamber 250 to each other. The second channel 224 may be a path through which the light emitting element LD accommodated in the second reservoir 44 is provided. Accordingly, the light emitting element LD provided from the second reservoir 44 may be provided to the mix chamber 250 via the second channel 224.

According to an embodiment, a surface treatment for preventing static electricity may be performed on an inner surface of the second channel 224. Experimentally, due to a polarity of the light emitting element LD, there was some possibility that movement of the light emitting element LD in the second channel 224 would be interfered, but by the surface treatment, the movement of the light emitting element LD in the second channel 224 may become smooth.

According to an embodiment, the first channel 222 and the second channel 224 may be provided in a manifold form. For example, the first channel 222 may include a first body channel 223 and first branch channels 226. Similarly, the second channel 224 may include a second body channel 225 and second branch channels 228.

According to an embodiment, the first body channel 223 may be connected with the first branch channel 226 at positions, respectively. The second body channel 225 may be connected with the second branch channel 228 at positions, respectively.

According to an embodiment, the first branch channel 226 may be connected with the first body channel 223, and thus the solvent SLV provided to the first body channel 223 may be provided to the first branch channel 226. The first branch channel 226 may connect the first body channel 223 and the mix chamber 250.

According to an embodiment, the second branch channel 228 may be connected with the second body channel 225, and thus the light emitting element LD provided in the second body channel 225 may be provided the second branch channel 228. The second branch channel 228 may connect the second body channel 225 and the mix chamber 250.

According to an embodiment, a diameter of the second branch channel 228 may be greater than that of the light emitting element LD. According to an example, the diameter of the second branch channel 228 may be within 100 µm, but is not limited thereto.

The counting unit 230 may be disposed adjacent to the second channel 224. The counting unit 230 may be disposed adjacent to the second branch channel 228 of the second channel 224.

For example, the counting unit 230 may contact the second branch channel 228 (refer to FIG. 8), but is not limited thereto. According to another example, the counting unit 230 may not form a contact surface with the second branch channel 228, and may be disposed adjacent to a position where the second branch channel 228 and the mix chamber 250 are connected to each other (refer to FIG. 9).

According to an embodiment, the counting unit 230 may obtain information on an amount of the light emitting element LD. The counting unit 230 may obtain information on the number of light emitting elements LD.

The number of light emitting elements LD in the specification may mean the number of light emitting elements LD passing through the second channel 224 or the second branch channel 228.

According to an embodiment, the counting unit 230 may include a device for obtaining image information. For example, the counting unit 230 may be an image analyzer.

The counting unit 230 may be a device using a charge coupled device (CCD) method. Here, the counting unit 230 may capture an image of the light emitting element LD passing through the second branch channel 228, and the captured image (or image) may include the information on the number of light emitting elements LD. The information on the number of light emitting elements LD may mean data information for calculating the number (or amount) of the light emitting elements LD. According to an example, the control unit 50 may calculate the number (or amount) of the light emitting elements LD from the information on the number of the light emitting elements LD.

However, the disclosure is not limited to the above-described example, and the counting unit 230 may be implemented in various methods. For example, the counting unit 230 may be implemented using any one of a laser diffraction method, a dynamic light scattering method, and an electronic sensing method.

The open and close unit 240 may be disposed between the second channel 224 and the mix chamber 250. The open and close unit 240 may be disposed between the second branch channel 228 and the mix chamber 250.

According to an embodiment, the open and close unit 240 may have an open state or a close state. The pose of the open and close unit 240 may be changed from the open state to the close state, or may be changed from the close state to the open state. The control unit 50 may control the pose of the open and close unit 240 to be changed.

According to an embodiment, in the open state, the open and close unit 240 may not separate the second channel 224 and the mix chamber 250 from each other. In the open state, the pose of the open and close unit 240 may be provided to fluidly connect the second channel 224 and the mix chamber 250 to each other, and thus the light emitting element LD may be provided to the mix chamber 250.

According to an embodiment, in the close state, the open and close unit 240 may separate the second channel 224 and the mix chamber 250 from each other. In the close state, the open and close unit 240 may fluidly block the second channel 224 and the mix chamber 250 from each other, so that the light emitting element LD may not be provided to the mix chamber 250.

According to an embodiment, the open and close unit 240 may be implemented in a shutter method, but is not limited thereto. A technique of interfering a material or a fluid so that the material or the fluid is difficult to move may be applied to a shape and an operation method of the open and close unit 240.

According to an embodiment, whether the open and close unit 240 is operated may be determined based on the information on the number of light emitting elements LD obtained from the counting unit 230. For example, the control unit 50 may determine whether the number of light emitting elements LD is required to be increased or is required to be decreased based on the information on the light emitting elements LD obtained from the counting unit 230.

For example, in case that the control unit 50 determines that the number of light emitting elements LD is required to be increased, the open and close unit 240 may open the second channel 224 so that the light emitting element LD moves to the mix chamber 250. In case that the control unit 50 determines that the number of light emitting elements LD is required to be decreased, the open and close unit 240 may close the second channel 224 so that the light emitting element LD may not move to the mix chamber 250.

According to an embodiment, in case that the control unit 50 receives a first number signal from the counting unit 230, a first operation may be performed. In case that the control unit 50 receives the first number signal, the control unit 50 may control the open and close unit 240 to maintain the close state or control the open and close unit 240 to change the state from the open state to the close state. By way of example, according to an embodiment, in case that the control unit 50 receives the first number signal, the control unit 50 may not perform a separate operation on the open and close unit 240. Here, the first number signal may mean a number signal indicating that the light emitting element LD of an amount greater than a reference number of the light emitting element LD passes through the second branch channel 228.

According to an embodiment, in case that the control unit 50 receives a second number signal from the counting unit 230, a second operation may be performed. In case that the control unit 50 receives the second number signal, the control unit 50 may control the open and close unit 240 to maintain the open state or control the open and close unit 240 to change the state from the close state to the open state. By way of example, according to an embodiment, in case that the control unit 50 receives the second number signal, the control unit 50 may not perform a separate operation on the open and close unit 240. Here, the second number signal may mean a number signal indicating that an amount of the light emitting element LD less than a reference number of the light emitting elements LD passes through the second branch channel 228.

The mix chamber 250 may be disposed under or below the print head unit 20 in the housing 210. The mix chamber 250 may be disposed between the first channel 222 and the second channel 224 and the nozzle 260. The mix chamber 250 may be disposed between the nozzle 260 and the first branch channel 226. The mix chamber 250 may be disposed between the nozzle 260 and the second branch channel 228.

According to an embodiment, the mix chamber 250 may include a space to accommodate the fluid. For example, the ink INK may be provided in the mix chamber 250 before the ink INK is provided on the substrate 100.

According to an embodiment, the mix chamber 250 may be connected to the first channel 222 and the second channel 224. For example, the mix chamber 250 may be connected to the first channel 222, and thus the solvent SLV may be provided. The mix chamber 250 may be connected to the second channel 224, and thus the light emitting element LD may be provided. Accordingly, the solvent SLV and the light emitting element LD may be mixed, and thus the ink INK for manufacturing the display device according to an embodiment may be provided.

According to an embodiment, the mix chamber 250 may be fluidly connected to each of at least one of the first branch channels 226 and at least one of the second branch channels 228.

According to an embodiment, mix chambers 250 may be provided. Each of the mix chambers 250 may correspond to at least one of the nozzles 260.

The nozzle 260 may be disposed under or below the mix chamber 250. The nozzle 260 may determine a flow direction of the fluid. The nozzle 260 may connect an outside of the print head unit 20 and the mix chamber 250. The ink INK accommodated in the mix chamber 250 may be provided (or discharged) to the outside through the nozzle 260. According to an example, the nozzle 260 may have a substantially tubular shape, but is not limited thereto.

Hereinafter, the counting unit 230 and the movement inducement unit 290 according to an embodiment are described with reference to FIGS. 8 to 10.

Figure 8:
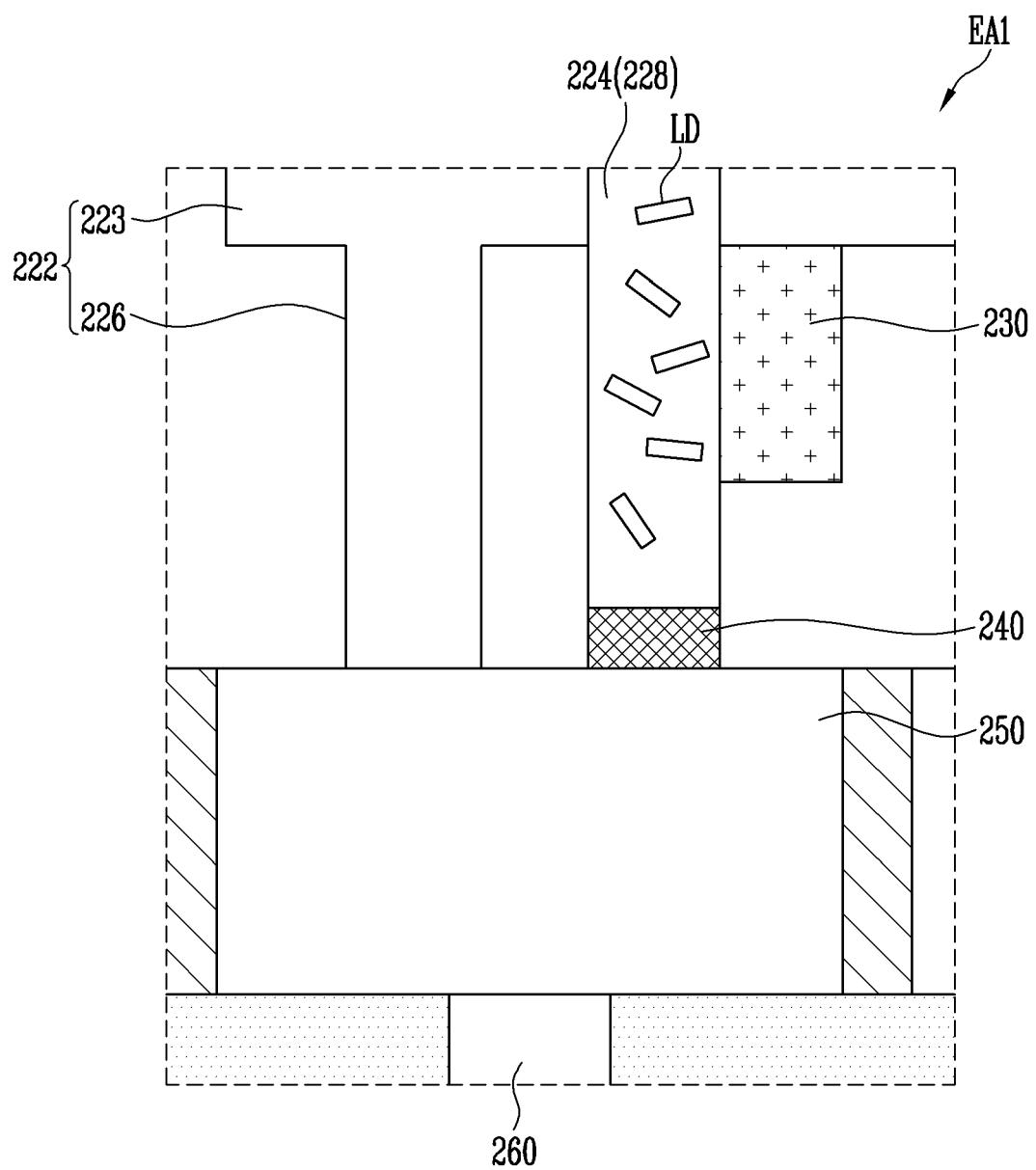
FIGS. 8 and 9 are enlarged views of EA1 region of FIG. 7.
Figure 9:
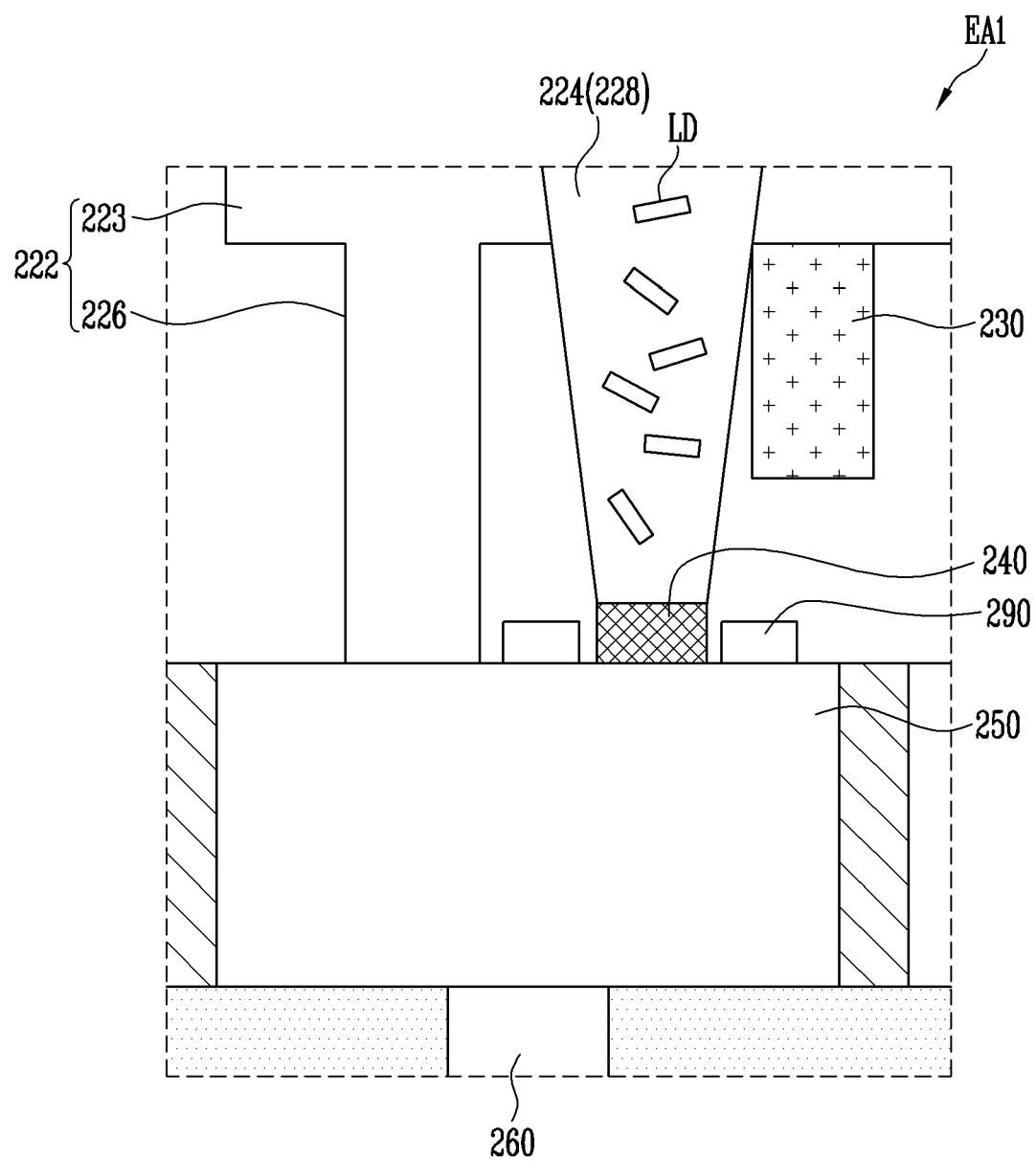

FIGS. 8 and 9 are enlarged views of EA1 region of FIG. 7. FIG. 8 may be a diagram illustrating a structure of the counting unit 230 according to an embodiment. FIG. 9 may be a diagram illustrating the structure of the counting unit 230 according to an embodiment.

First, referring to FIG. 8, the counting unit 230 may be adjacent to the second channel 224 (or the second branch channel 228) to obtain the information on the number of light emitting elements LD.

According to an embodiment, the counting unit 230 may be disposed above the open and close unit 240, and may count the number of light emitting elements LD before the light emitting element LD is moved to the mix chamber 250. The counting unit 230 may obtain information provided to determine the number of light emitting elements LD and transmit the information to the control unit 50.

According to an embodiment, the control unit 50 may calculate the number of light emitting elements LD passing through the second branch channel 228 corresponding to the counting unit 230, based on the information on the number of light emitting elements LD transmitted from the counting unit 230. For example, the control unit 50 may obtain the number of light emitting elements LD passing through a position of the second branch channel 228 between a first time point and a second time point after the first time point.

According to an embodiment, the control unit 50 may determine whether the open and close unit 240 is open or closed, based on the information on the number of light emitting elements LD transmitted from the counting unit 230.

For example, the control unit 50 may store a numerical range of the light emitting element LD. According to an embodiment, the numerical range may be stored in a separate storage unit. In case that the number of light emitting elements LD obtained based on the information provided from the counting unit 230 is less than the numerical range of the light emitting element LD, the control unit 50 may maintain the open and close unit 240 to be in the open state or change the open and close unit 240 from the close state to the open state. In case that the number of light emitting elements LD obtained based on the information provided from the counting unit 230 is greater than the numerical range of the light emitting element LD, the control unit 50 may maintain the open and close unit 240 to be in the close state or change the open and close unit 240 from the open state to the close state.

Accordingly, the number of light emitting elements LD may be appropriately selected within a numerical range required in a process. As described above, before the light emitting element LD is moved to the mix chamber 250, the information on the number of light emitting elements LD may be obtained by the counting unit 230, and thus the number of light emitting elements LD in the ink INK may be adjusted. Thus, the number of light emitting elements LD provided on the substrate 100 may be appropriately selected, and thus a process cost may be reduced, and the amount (or a ratio) of the light emitting elements LD for each region of the pixel PXL may be uniformly provided.

The second branch channel 228 and the movement inducement unit 290 according to an embodiment are described with reference to FIG. 9.

According to an embodiment, the cross-sectional area of the second branch channel 228 may be different according to a length direction of the second branch channel 228. The second branch channel 228 may have a substantially funnel shape. For example, the second branch channel 228 may have a smaller cross-sectional area as the second branch channel 228 is adjacent to the mix chamber 250. The second branch channel 228 may have a smaller cross-sectional area as the second branch channel 228 is adjacent to the open and close unit 240.

According to an embodiment, a position of the light emitting element LD may be efficiently changed in the second branch channel 228. For example, the light emitting element LD may rotate along an inner side surface of the second branch channel 228 and move toward the mix chamber 250. Accordingly, movement efficiency of the light emitting element LD may be improved.

According to an embodiment, the movement inducement unit 290 may be disposed adjacent to a lower end of the second branch channel 228. The movement inducement unit 290 may be disposed between the second branch channel 228 and the mix chamber 250.

According to an embodiment, movement inducement units 290 may be provided. According to an example, any one of the movement inducement units 290 may be disposed on one side or on a side of the second branch channel 228, and another one of the movement inducement units 290 may be disposed on another side of the second branch channel 228.

According to an embodiment, the movement inducement unit 290 may move the light emitting element LD to the mix chamber 250. For example, the light emitting element LD may be moved from the second branch channel 228 toward the mix chamber 250 (or the open and close unit 240) along a gravity direction. The movement inducement unit 290 may promote the movement of the light emitting element LD by applying an external force to the light emitting element LD in the gravity direction. The movement inducement unit 290 may apply the external force to the light emitting element LD in the second channel 224 toward the mix chamber 250.

According to an embodiment, the movement inducement unit 290 may form an electric field that may be applied to the light emitting element LD. As described above with reference to FIGS. 1 and 2, the light emitting element LD may have the polarity, and the electric field formed by the movement inducement unit 290 may cause the light emitting element LD to face the mix chamber 250. According to an example, the movement inducement unit 290 may be implemented in an electrode form (for example, referred to as an electrode member) capable of applying an electrical signal.

The movement inducement unit 290 according to an embodiment is described with reference to FIG. 10. FIG. 10 is an enlarged view of EA2 of FIG. 7.

Figure 10:
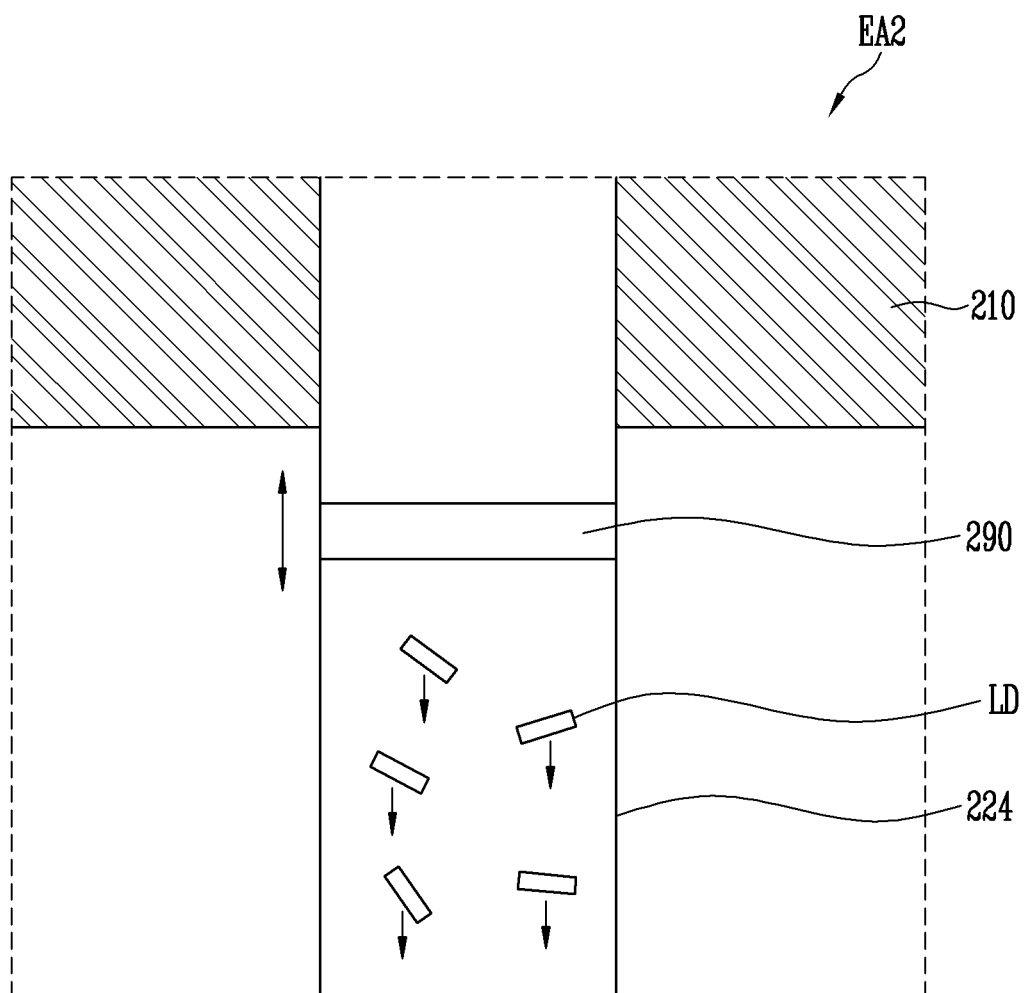
FIG. 10 is an enlarged view of EA2 of FIG. 7.

Referring to FIG. 10, the movement inducement unit 290 may be disposed in the second channel 224. The movement inducement unit 290 may be disposed in the second channel 224 between the second body channel 225 and the second reservoir 44.

According to an embodiment, a position of the movement inducement unit 290 may be changed. The movement inducement unit 290 may be moved in a push direction. The position of the movement inducement unit 290 may be changed in the push direction so that the light emitting element LD is moved within the second channel 224. According to an example, an operation of the movement inducement unit 290 may be controlled by the control unit 50. After the movement inducement unit 290 is moved in the push direction, the movement inducement unit 290 may move in a direction opposite to the push direction, and may be re-arranged before at an initial position (before moving in the push direction).

According to an embodiment, the push direction may mean a direction from the second reservoir 44 toward the second channel 224. The push direction may mean a gravity direction. The push direction may mean a direction fluidly facing the mix chamber 250.

According to an embodiment, the movement inducement unit 290 may include an actuator. For example, the movement inducement unit 290 may be implemented in a piezo actuator method, but is not limited to a given example.

According to an embodiment, the movement inducement unit 290 may change the position of the light emitting element LD. In case that the movement inducement unit 290 is moved in the push direction, the light emitting element LD may receive an external force in a direction corresponding to the push direction within the second channel 224. Accordingly, the light emitting element LD may be moved within the second channel 224 and may be moved to the second branch channel 228 of the second channel 224.

Although not separately shown in FIG. 10, according to an embodiment, the movement inducement unit 290 may include an air flow generation unit.

According to an embodiment, the movement inducement unit 290 may generate an air flow (for example, wind) in the second channel 224. For example, the movement inducement unit 290 may include an air flow generation unit having a propeller or substantially propeller shape and may provide the air flow to the light emitting element LD.

According to an embodiment, the light emitting element LD may be moved within the second channel 224, and may be moved to the second branch channel 228 of the second channel 224, by the air flow generated by the movement inducement unit 290. The generated air flow may be fluidly formed in a direction toward the mix chamber 250.

Although not separately shown in FIG. 10, according to an embodiment, the movement inducement unit 290 may include a vibration inducement unit.

According to an embodiment, the movement inducement unit 290 may apply a vibration to the second channel 224. Accordingly, the light emitting element LD in the second channel 224 may be moved in the direction toward the mix chamber 250, by the vibration of the movement inducement unit 290.

Hereinafter, the print head unit 20 and the reservoir 40 according to an embodiment are described with reference to FIGS. 11 and 12.

Hereinafter, a content repetitive to the above-described content may be omitted or briefly described, and contents related to another embodiment, a point different from the content related to an embodiment is described.

Figure 11:
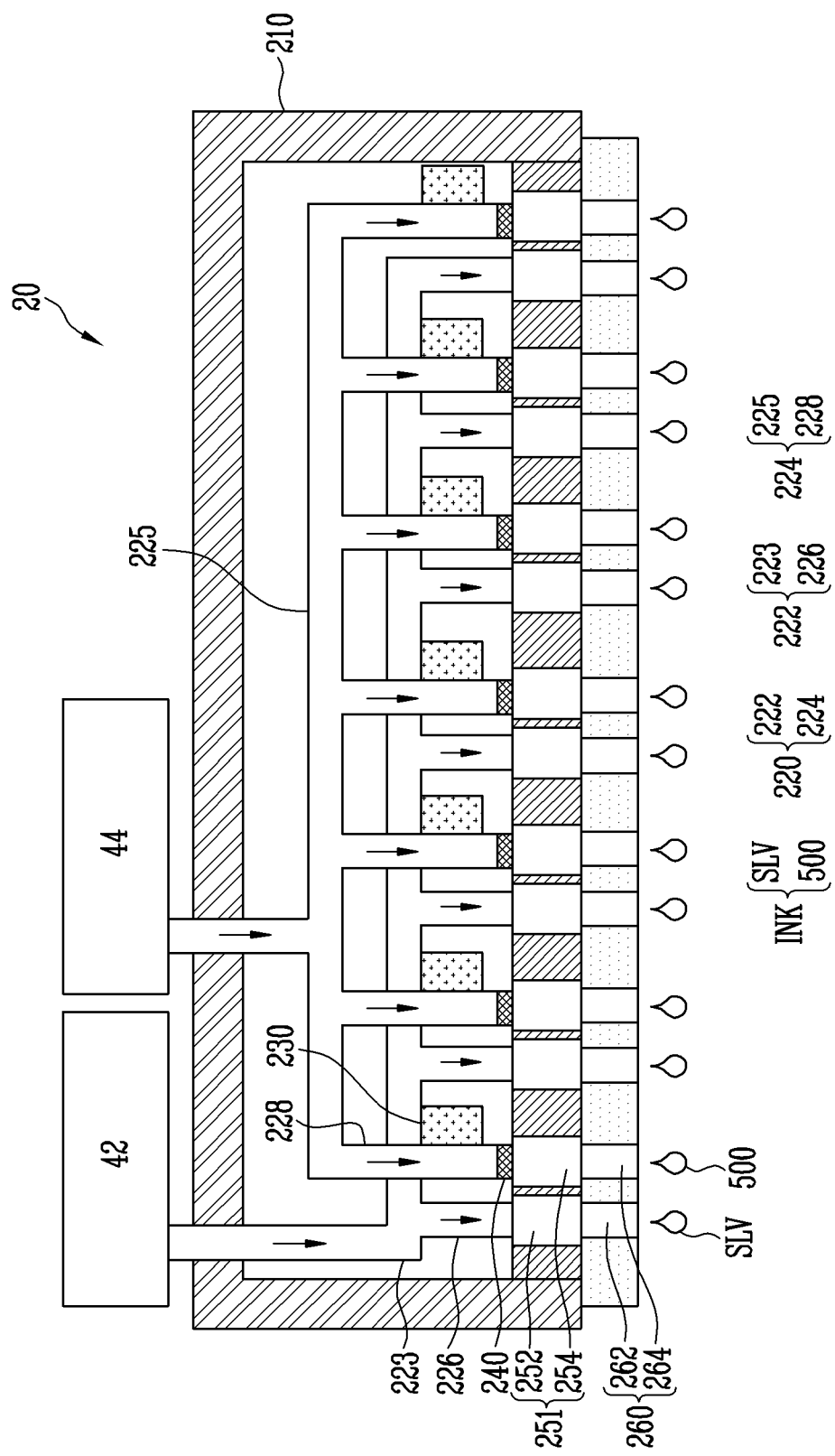
FIG. 11 is a schematic cross-sectional view schematically illustrating a print head unit and a reservoir according to an embodiment.

FIG. 11 is a schematic cross-sectional view schematically illustrating the print head unit and the reservoir according to an embodiment. FIG. 12 is a schematic cross-sectional view schematically illustrating the print head unit and the reservoir according to an embodiment.

The other embodiment shown in FIG. 11 may be different from an embodiment shown in FIG. 7 in that the other embodiment shown in FIG. 11 may include an individual mix chamber 251.

Referring to FIG. 11, the manufacturing apparatus 1 according to the other embodiment may include the individual mix chamber 251.

The individual mix chamber 251 of the manufacturing apparatus 1 according to an embodiment may include a first mix chamber 252 and a second mix chamber 254. The nozzle 260 of the manufacturing apparatus 1 according to an embodiment may include a first nozzle 262 and a second nozzle 264.

The first mix chamber 252 may be disposed between the first branch channel 226 and the first nozzle 262. The second mix chamber 254 may be disposed between the second branch channel 228 and the second nozzle 264.

According to an embodiment, the first channel 222 may be connected to the first mix chamber 252. The first mix chamber 252 may be fluidly connected to the first branch channel 226. The first mix chamber 252 may be fluidly connected to the first nozzle 262.

According to an embodiment, the first nozzle 262 may be connected to the first mix chamber 252 and may receive the fluid (or material) from the first mix chamber 252. The first nozzle 262 may provide the fluid (or material) accommodated in the first reservoir 42 to the outside. For example, the first nozzle 262 may discharge the solvent SLV to the outside.

According to an embodiment, the second channel 224 may be connected to the second mix chamber 254. The second mix chamber 254 may be fluidly connected to the second branch channel 228. The second mix chamber 254 may be fluidly connected to the second nozzle 264.

According to an embodiment, the second nozzle 264 may be connected to the second mix chamber 254 and may receive the fluid (or material) from the second mix chamber 254. The second nozzle 264 may receive the fluid (or material) accommodated in the second reservoir 44. For example, the second nozzle 264 may discharge the light emitting element ink 500 to the outside.

According to an embodiment, the light emitting element ink 500 may be accommodated in the second reservoir 44. The light emitting element ink 500 may include the fluid and the light emitting element LD dispersed in the fluid. At this time, the fluid may mean a material substantially the same as the solvent SLV included in the ink INK. According to an example, a viscosity of the fluid may have 5 cp to 80 cp, but is not limited thereto.

According to an embodiment, the open and close unit 240 may adjust the number of ink drops of the light emitting element ink 500. For example, the open and close unit 240 may maintain the open state during a first time so that a first ink amount is included in the mix chamber 250, and may maintain the open state during a second state longer than the first state so that a second ink amount greater than the first ink amount is included in the mix chamber 250.

According to an embodiment, the first nozzle 262 and the second nozzle 264 may sequentially discharge each fluid (or material) with a time difference with respect to a point. For example, the second nozzle 264 may provide the light emitting element ink 500 to a spray position at a first time point, and the first nozzle 262 may provide the solvent SLV to the spray position at a second time point after the first time point. Accordingly, after the second time point, the light emitting element ink 500 and the solvent SLV may be mixed at the spray position, and thus the ink INK may be provided on the substrate 100.

By way of example, according to an embodiment, the first nozzle 262 may provide the solvent SLV to the spray position at the first time point, and the second nozzle 264 may provide the light emitting element ink 500 to the spray position at the second time point after the first time point.

Figure 12:
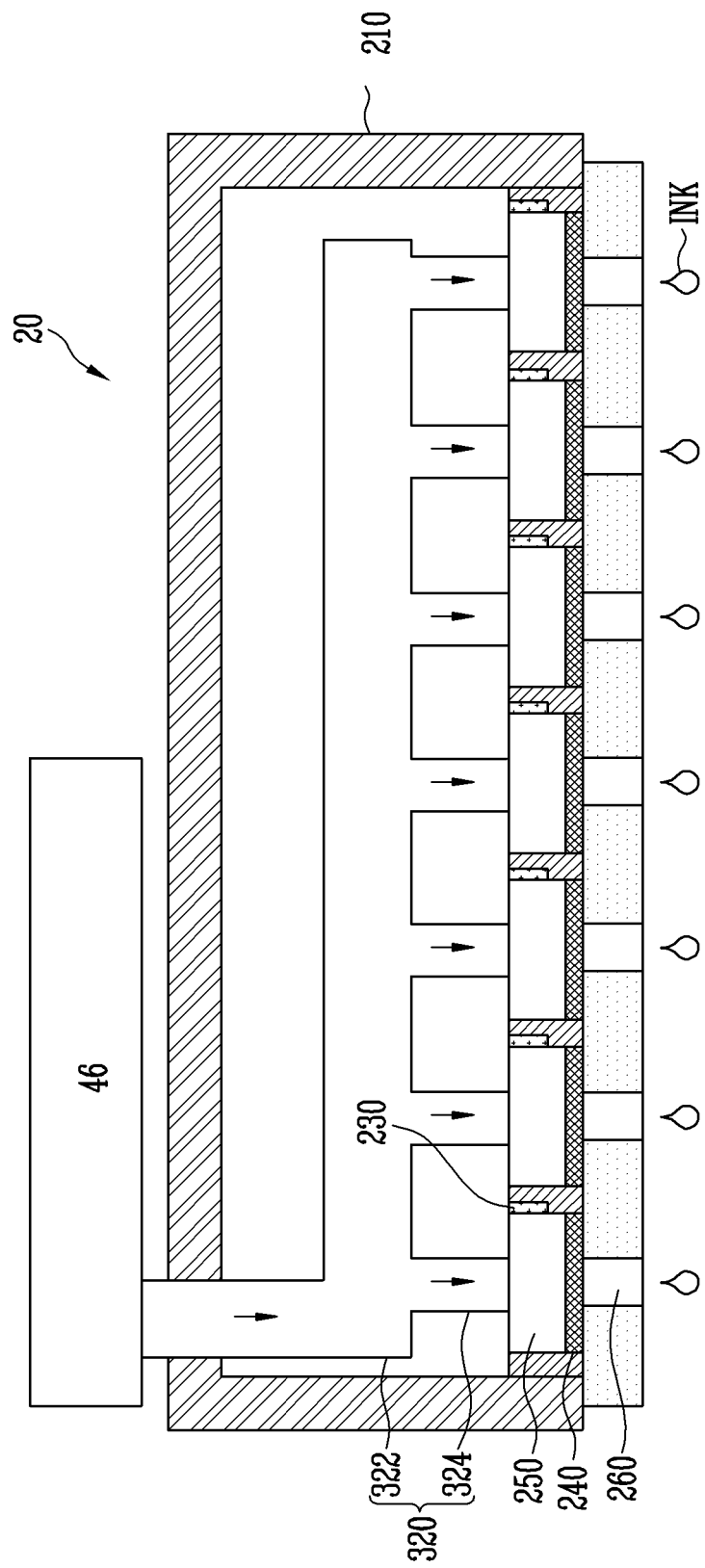
FIG. 12 is a schematic cross-sectional view schematically illustrating a print head unit and a reservoir according to an embodiment.

Compared with an embodiment shown in FIG. 7, an embodiment shown in FIG. 12 has a difference in that the first reservoir 42 and the second reservoir 44 may be integrated or integral with each other, and the first channel 222 and the second channel 224 may be integrated or integral with each other.

Referring to FIG. 12, the manufacturing apparatus 1 according to an embodiment may include an integrated reservoir 46 and an integrated channel 320.

The integrated reservoir 46 may accommodate the ink INK. The light emitting element LD and the solvent SLV may be accommodated in the integrated reservoir 46.

The integrated channel 320 may be fluidly connected to the integrated reservoir 46. According to an example, the ink INK provided from the integrated reservoir 46 may be moved to the integrated channel 320.

According to an embodiment, the integrated channel 320 may include an integrated body channel 322 and an integrated branch channel 324.

According to an embodiment, the integrated body channel 322 may be connected with the integrated branch channel 324. Accordingly, the ink INK provided through the integrated body channel 322 may be provided to the integrated branch channel 324 connected with the mix chamber 250.

According to an embodiment, integrated branch channels 324 may be provided and may be extended from the integrated body channel 322. The integrated branch channels 324 may be connected to the mix chambers 250, respectively. According to an example, the number of integrated branch channels 324 may be the same as the number of mix chambers 250.

According to an embodiment, the counting unit 230 may be disposed on one side or on a side of the mix chamber 250. By way of example, the counting unit 230 may be disposed on the mix chamber 250 or on one side or on a side of the integrated branch channel 324.

According to an embodiment, the open and close unit 240 may be disposed under or below the mix chamber 250. The mix chamber 250 may include a discharge path. At this time, the discharge path may be opened or blocked by the open and close unit 240.

According to an embodiment, in case that the open and close unit 240 is disposed in the open state (for example, in case that the discharge path is opened), the ink INK accommodated in the mix chamber 250 may be discharged to the outside through the nozzle 260. In case that the open and close unit 240 is disposed in the close state (for example, in case that the discharge path is closed), the ink INK accommodated in the mix chamber 250 may be prevented from being discharged to the outside through the nozzle 260.

According to an embodiment, the open and close unit 240 may open or close the discharge path based on the information on the number of light emitting elements LD in the mix chamber 250 obtained from the counting unit 230. The control unit 50 may calculate the number of light emitting elements LD in the mix chamber 250 from the information on the number of light emitting elements LD in the mix chamber 250.

According to an embodiment, in case that the number of light emitting elements LD in the mix chamber 250 is greater than or equal to (or exceeds) a number, the open and close unit 240 may close the discharge path of the mix chamber 250. In case that the number of light emitting elements LD in the mix chamber 250 is less than or equal to (or less than) the number, the open and close unit 240 may open the discharge path of the mix chamber 250.

Hereinafter, a method of manufacturing a display device using the display device manufacturing apparatus 1 according to an embodiment is described with reference to FIGS. 13 to 19.

Figure 13:
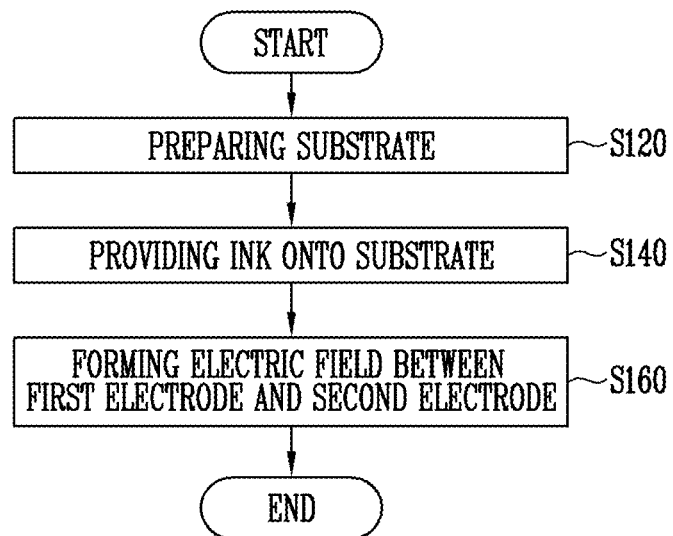
FIG. 13 is a flowchart illustrating a method of manufacturing a display device using display device manufacturing apparatus according to an embodiment.
Figure 14:
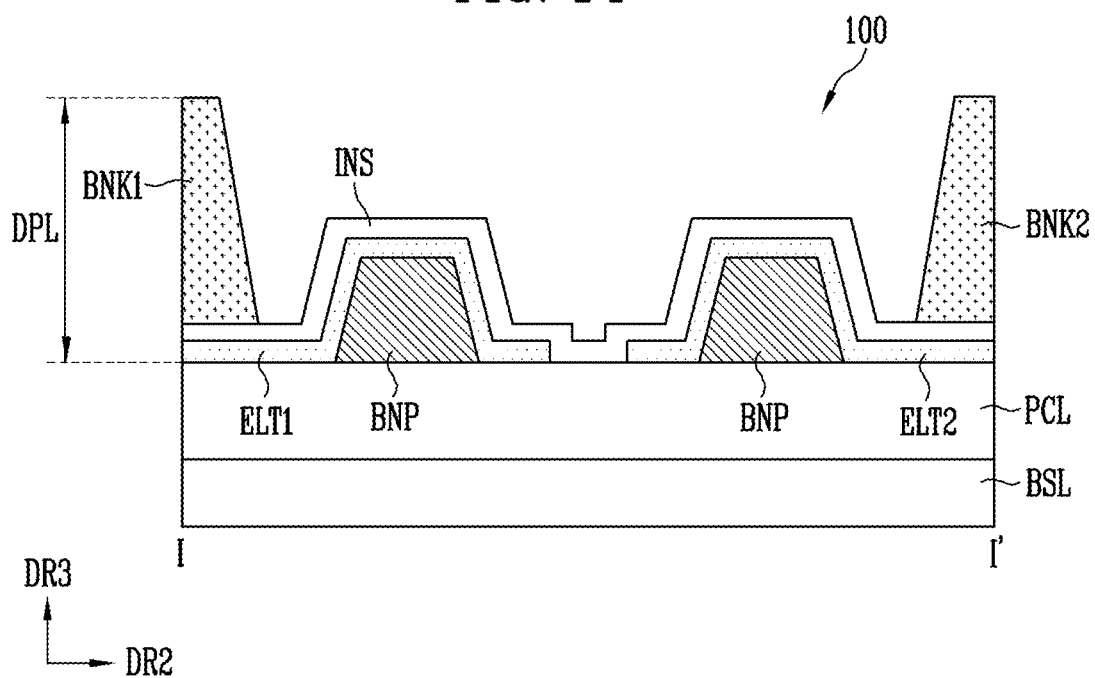
FIGS. 14 and 18 are schematic cross-sectional views illustrating a substrate during a process step of a method of manufacturing a display device using a display device manufacturing apparatus according to an embodiment.
Figure 15:
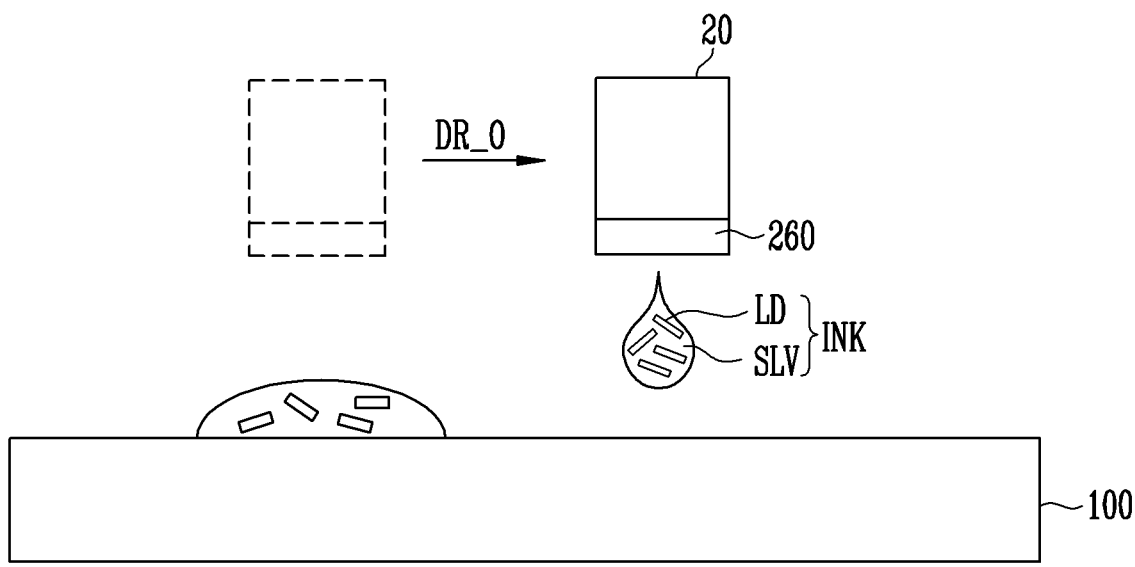
FIGS. 15 and 16 are schematic cross-sectional views for each process step of a method of manufacturing a display device using a display device manufacturing apparatus according to an embodiment.
Figure 16:
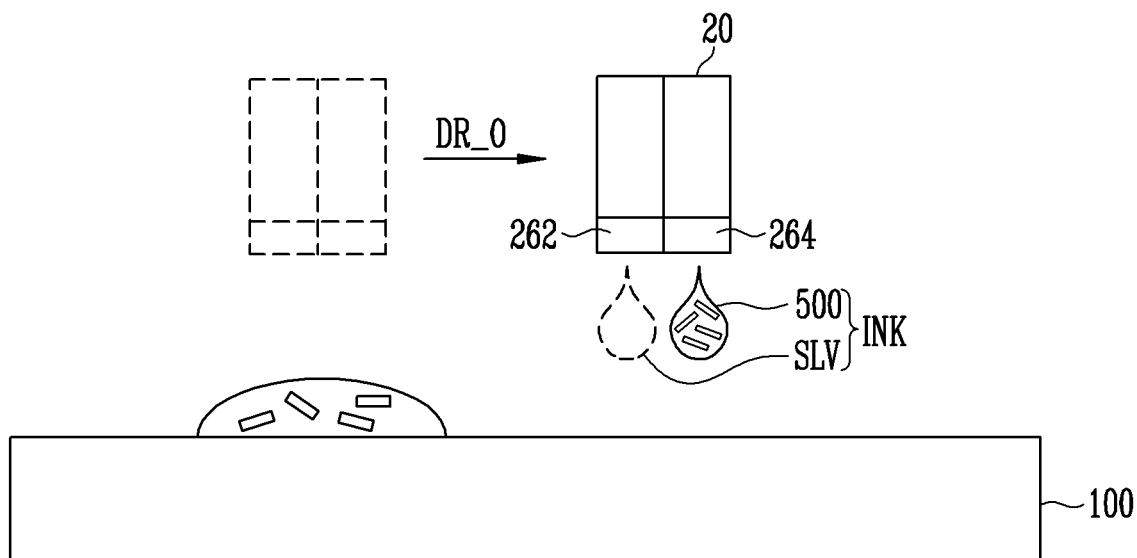
Figure 17:
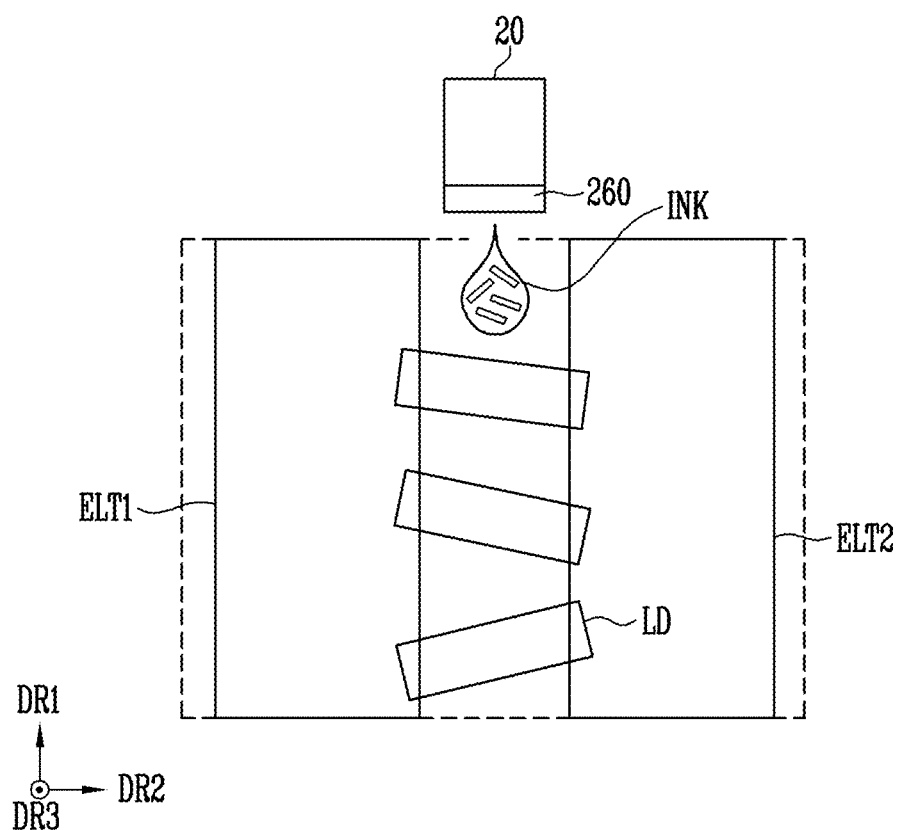
FIGS. 17 and 19 are schematic plan views illustrating a method of manufacturing a display device using a display device manufacturing apparatus according to an embodiment.
Figure 18:
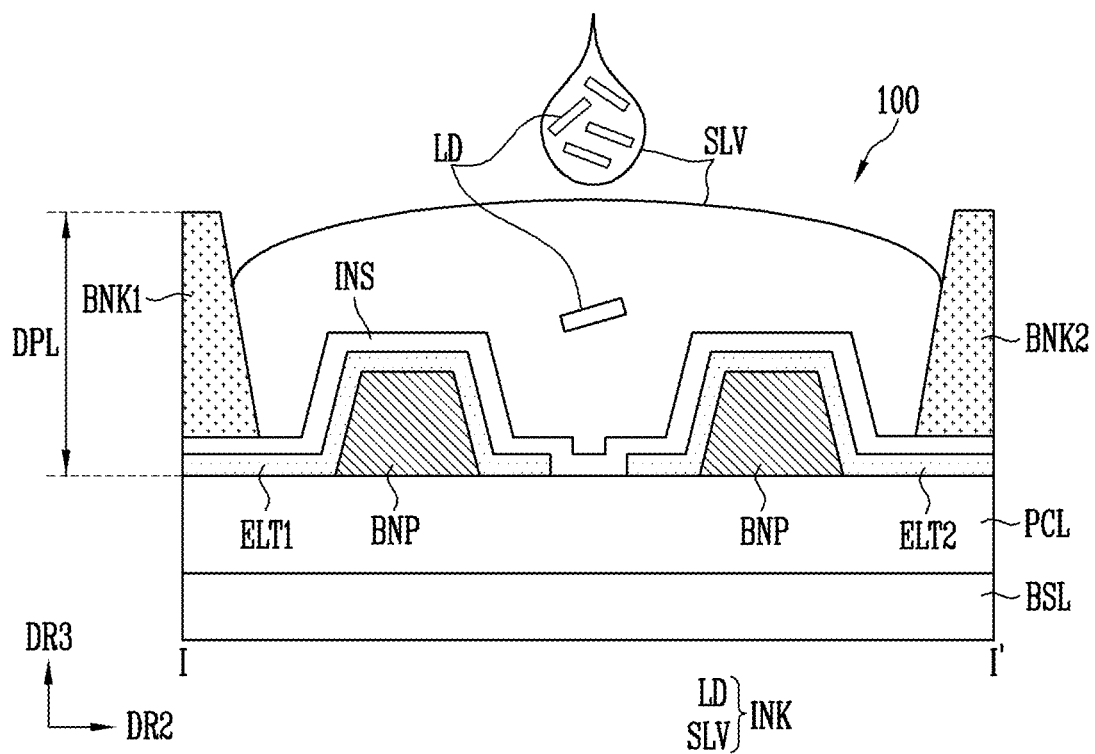
Figure 19:
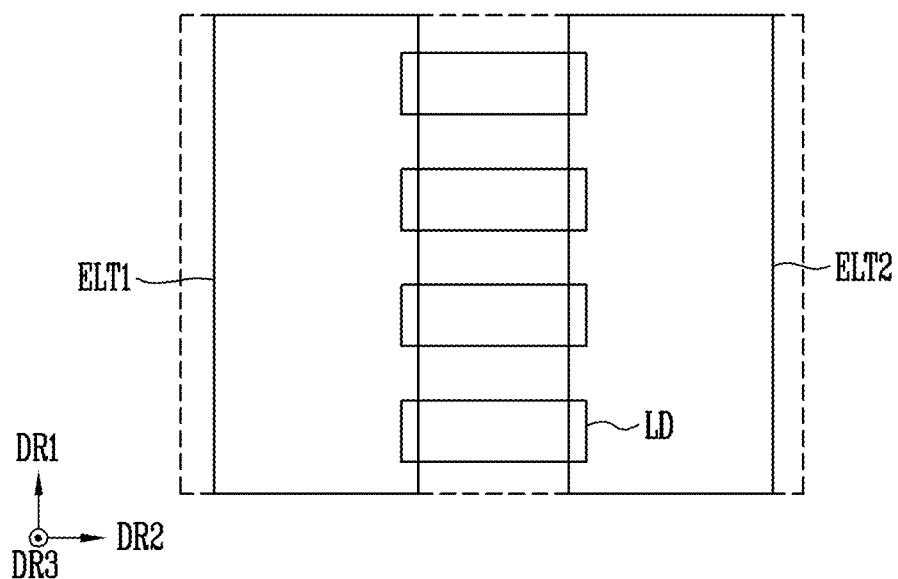

FIG. 13 is a flowchart illustrating the method of manufacturing the display device using display device manufacturing apparatus according to an embodiment. FIGS. 14 and 18 are schematic cross-sectional views illustrating a substrate during a process step of the method of manufacturing the display device using the display device manufacturing apparatus according to an embodiment. FIGS. 15 and 16 are schematic cross-sectional views for each process step of the method of manufacturing the display device using the display device manufacturing apparatus according to an embodiment. FIGS. 17 and 19 are schematic plan views illustrating the method of manufacturing the display device using the display device manufacturing apparatus according to an embodiment.

Referring to FIG. 13, the method of manufacturing the display device according to an embodiment may include preparing the substrate (S120), providing the ink on the substrate (S140), and applying the electric field between the first electrode and the second electrode (S160).

First, in preparing the substrate (S120), the substrate 100 described above with reference to FIG. 5 may be prepared. Referring to FIG. 14, the substrate 100 may include the base substrate BSL and the pixel circuit part PCL disposed on the base substrate BSL. Individual configurations of the pixel circuit part PCL may be formed by patterning a conductive layer (or a metal layer), an inorganic material, or an organic material by performing a process using a mask.

The bank pattern BNP, the first electrode ELT1, the second electrode ELT2, the insulating layer INS, the first bank BNK1, and the second bank BNK2 may be disposed on the pixel circuit part PCL. A region in which the ink INK may be provided may be formed or disposed in a region between the first bank BNK1 and the second bank BNK2.

In providing the ink on the substrate (S140), the ink INK may be provided on the substrate 100. Referring to FIGS. 15 to 17 and 18, the ink INK may be provided on the substrate 100.

In FIGS. 15 to 17 and 18, the ink INK may be discharged onto the substrate 100 from the manufacturing apparatus 1. However, for convenience of description, the manufacturing apparatus 1 is shown based on the print head unit 20 and description is given based on the print head unit 20.

According to an embodiment, the print head unit 20 may be moved along an operation direction DR_0, and may provide the ink INK. The operation direction DR_0 may mean an arrow direction in FIGS. 15 and 16, as an example.

According to an embodiment, the print head unit 20 may discharge the ink INK to a first position at the first time point, and discharge the ink INK to a second position at the second time point after the first time point. In FIGS. 15 and 16, an embodiment in which the print head unit 20 discharges the ink INK at the first time point is shown by a dotted line. In FIGS. 15 and 16, an embodiment in which the print head unit 20 discharges the ink INK at the second time point is shown by a solid line.

FIG. 15 shows a process of providing the ink INK using the print head unit 20 according to an embodiment (FIG. 7) or an embodiment (FIG. 12), and FIG. 17 shows a process of providing the ink INK using the print head unit 20 according to an embodiment (FIG. 11).

According to an embodiment, referring to FIG. 15, the ink INK in a state in which the light emitting element LD and the solvent SLV are mixed may be provided on the substrate 100. Although not shown in the drawing, the ink INK including the light emitting element LD and the solvent SLV may be provided in the mix chamber 250, and may be provided on the substrate 100 as the process is performed.

According to an embodiment, referring to FIG. 16, the solvent SLV and the light emitting element ink 500 may be provided on the substrate 100. According to an example, the light emitting element ink 500 may be discharged through the second nozzle 264 of the print head unit 20, and the solvent SLV may be discharged through the first nozzle 262 of the print head unit 20.

At this time, the solvent SLV discharged through the first nozzle 262 and the light emitting element ink 500 discharged through the second nozzle 264 may be provided at the same position (for example, the spray position), and may be provided at different times, respectively. For example, the print head unit 20 may move along the operation direction DR_0 as described above. At this time, the light emitting element ink 500 may be provided prior to the solvent SLV with respect to a region to which the ink INK is to be provided. After the light emitting element ink 500 is provided, the solvent SLV may be provided to the region to which the ink INK is to be provided.

However, the disclosure is not limited to the above-described embodiment, and according to an embodiment, the solvent SLV discharged through the first nozzle 262 and the light emitting element ink 500 discharged through the second nozzle 264 may be provided (or discharged) at the same time. The solvent SLV discharged through the first nozzle 262 and the light emitting element ink 500 discharged through the second nozzle 264 may be provided at the same time and may be mixed on the substrate 100. For example, a time period in which the solvent SLV is discharged from the first nozzle 262 and a time period in which the light emitting element ink 500 is discharged from the second nozzle 264 may at least overlap each other.

According to an embodiment, in case that the second nozzle 264 of the print head unit 20 is disposed at a position corresponding to the region to which the ink INK is to be provided (for example, overlapping a plane), the light emitting element ink 500 may be provided on the substrate 100. In case that the print head unit 20 is moved along the operation direction DR_0 and the first nozzle 262 of the print head unit 20 is disposed at the position corresponding to the region to which the ink INK is to be provided, the solvent SLV may be provided on the substrate 100.

According to an embodiment, the ink INK provided from the print head unit 20 may be accommodated between the first bank BNK1 and the second bank BNK2. (Refer to FIG. 18) The first bank BNK1 and the second bank BNK2 may form the region in which the ink INK may be accommodated.

According to an embodiment, at least a portion of the ink INK provided from the print head unit 20 may be disposed between the first electrode ELT1 and the second electrode ELT2. (Refer to FIG. 17) According to an example, at least a portion of the light emitting element LD included in the ink INK may be disposed adjacent to the first electrode ELT1 and the second electrode ELT2. Accordingly, the light emitting element LD may be disposed between the first electrode ELT1 and the second electrode ELT2, and may be non-uniformly arranged or disposed.

Thereafter, referring to FIGS. 13 and 19, in forming the electric field (S160), the electric field may be formed or disposed between the first electrode ELT1 and the second electrode ELT2.

According to an embodiment, in the current step, an alignment electric field may be formed or disposed (or provided) between the first electrode ELT1 and the second electrode ELT2 by applying an alignment signal to each of the first electrode ELT1 and the second electrode ELT2. The light emitting elements LD included in the ink INK may be aligned (or arranged or disposed) between the first electrode ELT1 and the second electrode ELT2, by the formed alignment electric field (refer to FIG. 19). At this time, an AC signal may be applied between the first electrode ELT1 and the second electrode ELT2. The AC signal may be a sine wave, a triangular wave, a step wave, or the like, but is not limited to a given example and may have various AC signal types.

Thereafter, although not shown in a separate drawing, the solvent SLV on the substrate 100 may be removed. However, according to an embodiment, a separate removal process for the solvent SLV may not be performed, and the solvent SLV may be volatilized and removed. By performing an additional process to form a first contact electrode, a second contact electrode, and other insulating layers, the display device according to an embodiment may be provided.

The above description is merely an example of the technical spirit and scope of the disclosure, and those skilled in the art to which the disclosure pertains will be able to make various modifications and variations without departing from the characteristics of the disclosure. Therefore, the embodiments described above may be implemented separately or in combination with each other.

Therefore, the disclosed embodiments are not intended to limit the technical spirit and scope of the disclosure, but to describe the technical spirit and scope of the disclosure, and the technical spirit and scope of the disclosure is not limited by these embodiments. The scope of the disclosure should be interpreted by the following claims, and it should be interpreted that all technical spirits and scope within the equivalent scope are included in the scope of the disclosure.

What is claimed is:

1. A display device manufacturing apparatus comprising:
a first reservoir that accommodates a solvent;
a second reservoir that accommodates light emitting elements; and
a print head including:
 a mix chamber that accommodates an ink including at least some of the solvent received from the first reservoir and one or more light emitting elements received from the second reservoir;
 a first channel fluidically connecting the first reservoir and the mix chamber;
 a second channel fluidically connecting the second reservoir and the mix chamber;
 a counter that, in response to a flow of the one or more light emitting elements in the second channel, obtains information on a number of the one or more light emitting elements flowing through a portion of the second channel; and
 an open and close unit fluidically disposed between the portion of the second channel and the mix chamber, the open and close unit being toggleable between an open state and a closed state based on the number of the one or more light emitting elements.

2. The display device manufacturing apparatus according to claim 1, wherein, upstream of the mix chamber, the first channel and the second channel are fluidically isolated from each other.

3. The display device manufacturing apparatus according to claim 2, wherein the first channel is a first manifold and the second channel is-ere a second manifold.

4. The display device manufacturing apparatus according to claim 2, wherein the first channel includes a first body channel and a first branch channel fluidically connected with the first body channel, the first branch channel being fluidically connected between the first body channel and the mix chamber, and the second channel includes a second body channel and a second branch channel fluidically connected with the second body channel, the second branch channel being fluidically connected between the second body channel and the mix chamber.

5. The display device manufacturing apparatus according to claim 4, wherein the counter is adjacent to the second branch channel.

6. The display device manufacturing apparatus according to claim 4, further comprising:
a controller electrically connected to the counter, wherein the portion of the second channel is a portion of the second branch channel, and
wherein the controller calculates a number of the one or more light emitting elements flowing through the portion of the second branch channel based on the information on the number of the one or more light emitting elements.

7. The display device manufacturing apparatus according to claim 4, wherein
in a case that the open and close unit has the close state, the second branch channel and the mix chamber are fluidically isolated from one another, and
in a case that the open and close unit has the open state, the second branch channel and the mix chamber are fluidically connected with one another.

8. The display device manufacturing apparatus according to claim 7, further comprising:
a controller communicatively coupled with the counter and the open and close unit,
wherein, as part of a print operation, the controller:
receives the information from the counter;
receives other information about an amount of light emitting elements to discharge per region of a same pixel; and
causes, at least in part, the open and close unit to toggle between the open state and the close state to dynamically adjust a number of light emitting elements forming the ink accommodated in the mix chamber based on the information and the other information.

9. The display device manufacturing apparatus according to claim 7, further comprising:
a controller electrically connected to the counter and the open and close unit, wherein
in a case that the controller receives a first number signal from the counter corresponding to a first number of the one or more light emitting elements, the controller compares the first number with a threshold. and in response to the first number signal being smaller than the threshold, toggles the open and close unit from the closed state to the open state, and
in a case that the controller receives a second number signal different from the first number signal from the counter corresponding to a second number of the one or more light emitting elements, the controller compares the second number with the threshold, and in response to the second number being greater than or equal to the threshold, toggles the open and close unit from the open state to the close state.

10. The display device manufacturing apparatus according to claim 4, wherein a cross-sectional area of the second branch channel differs according to a length direction of the second branch channel.

11. The display device manufacturing apparatus according to claim 1, wherein the counter is at least one of an image analyzer, a counter performing a laser diffraction method, a counter performing a dynamic light scattering method, or a counter performing an electronic sensing method.

12. The display device manufacturing apparatus according to claim 1, further comprising:
a nozzle, and
a controller electrically connected to the nozzle,
wherein the nozzle is fluidically connected to the mix chamber and discharges at least some of the ink accommodated in the mix chamber in response to a control signal from the controller.

13. The display device manufacturing apparatus according to claim 1, further comprising:
a movement inducement unit that induces movement of the one or more light emitting elements in the second channel,
wherein, in a case that the one or more light emitting elements are to flow to the mix chamber, the movement inducement unit applies an external force toward the mix chamber to the one or more light emitting elements to cause, at least in part, the one or more light emitting elements to flow in the second channel to the mix chamber.

14. The display device manufacturing apparatus according to claim 13, wherein the movement inducement unit is at least one of one or more electrodes that form an electric field in association with the portion of the second channel to orient the one or more light emitting elements and influence the flow of the one or more light emitting elements, an air flow generator that forms a flow of air in the second channel toward the mix chamber and influences the flow of the one or more light emitting elements, or an actuator disposed in the second channel and that applies the external force toward the mix chamber to the one or more light emitting elements to influence the flow of the one or more light emitting elements.

15. The display device manufacturing apparatus according to claim 1, further comprising:
a controller communicatively coupled with the print head,
wherein the controller causes, at least in part, the print head to discharge at least some of the ink accommodated in the mix chamber on a region of a pixel-by-region of a pixel basis so that each region of a pixel receives a plurality of light emitting elements.

16. The display device manufacturing apparatus according to claim 1, wherein an internal flow path of the second channel includes a surface treatment that mitigates generation of static electricity in association with the flow of the one or more light emitting elements in the second channel.

17. A display device manufacturing apparatus comprising:
a solvent reservoir:
a light emitting element reservoir;
a substrate stage: and
a print head overlving the substrate stage the print head including:
a first mix chamber fluidically connected with the solvent reservoir;
a second mix chamber fluidically connected with the light emitting element reservoir and fluidically isolated from the first mix chamber within the print head;

a first channel fluidically connecting the solvent reservoir with the first mix chamber:

a second channel fluidically connecting the light emitting element reservoir with the second mix chamber:

a counter disposed in association with the second channel and upstream from the second mix chamber and that, in response to a flow of light emitting elements from the light emitting element reservoir via the second channel, obtains information about a number of the light emitting elements flowing in the second channel;

a first nozzle fluidically connected with the first mix chamber: and a second nozzle fluidically connected with the second mix chamber.

18. The display device manufacturing apparatus according to claim 17, further comprising:

a controller communicatively coupled with the print head, wherein as part of a first print operation, the controller causes, at least in part, solvent to flow from the solvent reservoir to the first mix chamber, from the first mix chamber to the first nozzle, and from the first nozzle to a deposition position on the substrate stage, as part of a second print operation different from the first print operation, the controller causes, at least in part, the light emitting elements to flow from the light emitting element reservoir to the second mix chamber, from the second mix chamber to the second nozzle, and from the second nozzle to the deposition position, and the controller controls the print head to toggle between the first print operation and the second print operation to deposit and mix the solvent and the light emitting elements at the deposition position.

19. The display device manufacturing apparatus according to claim 18, wherein the light emitting element reservoir stores a fluid including light emitting elements, and the controller causes, at least in part, the print head to dynamically adjust a ratio of light emitting elements to solvent at the deposition position without affecting a viscosity of the fluid flowing through the print head.

* * * * *